US006961670B2

(12) United States Patent
Sasaki et al.

(10) Patent No.: US 6,961,670 B2
(45) Date of Patent: Nov. 1, 2005

(54) PROBE TESTING METHOD AND APPARATUS FOR DETERMINING ACCEPTABLE/DEFECTIVE END SHAPE OF CONTACT PROBE THROUGH IMAGE ANALYSIS

(75) Inventors: Yoshihiro Sasaki, Kanagawa (JP); Takashi Nishikawa, Tokyo (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 10/644,071

(22) Filed: Aug. 20, 2003

(65) Prior Publication Data

US 2004/0083073 A1 Apr. 29, 2004

(30) Foreign Application Priority Data

Aug. 21, 2002 (JP) .............................. 2002-240675

(51) Int. Cl.[7] .......................... G01R 31/14; G06F 19/00
(52) U.S. Cl. ...................... 702/117; 324/751; 324/754; 324/765; 702/39; 702/120
(58) Field of Search ................................ 702/107, 108, 702/117, 120, 159, 39, 168; 324/459, 754, 324/755, 760, 765, 210; 700/121, 108–110; 73/105

(56) References Cited

U.S. PATENT DOCUMENTS 5,475,613 A * 12/1995 Itoga et al. .................. 702/39
6,020,747 A * 2/2000 Bahns et al. ................ 324/754
6,137,295 A * 10/2000 Yoshida ...................... 324/751
6,590,409 B1 * 7/2003 Hsiung et al. .............. 324/765

* cited by examiner

*Primary Examiner*—Bryan Bui
*Assistant Examiner*—John Le
(74) *Attorney, Agent, or Firm*—Foley & Lardner LLP

(57) ABSTRACT

A probe testing apparatus reads the surface shape of a contact pad in pressure contact with a contact probe, and differentiates the read surface shape to extract a multiplicity of flat parts. Next, the probe testing apparatus complements the multiplicity of flat parts to generate a reference shape, and subtracts the reference shape from an averaged surface shape to detect a plurality of recesses having a predetermined depth or more. Next, the probe testing apparatus selects one from the plurality of recesses corresponding to reference information, enlarges the selected recess outward by predetermined dimensions, and subtracts the reference shape from the initial surface shape at the position of the enlarged recess to detect an impression of the contact probe. Finally, the probe testing apparatus determines from the position and depth of the detected impression whether the contact probe is acceptable or defective. In this manner, even if the compact pad is formed with miniature irregularities on the surface thereof, the probe testing apparatus can precisely detect the impression of the contact probe from the surface shape to determine whether the contact probe is acceptable or defective.

48 Claims, 11 Drawing Sheets

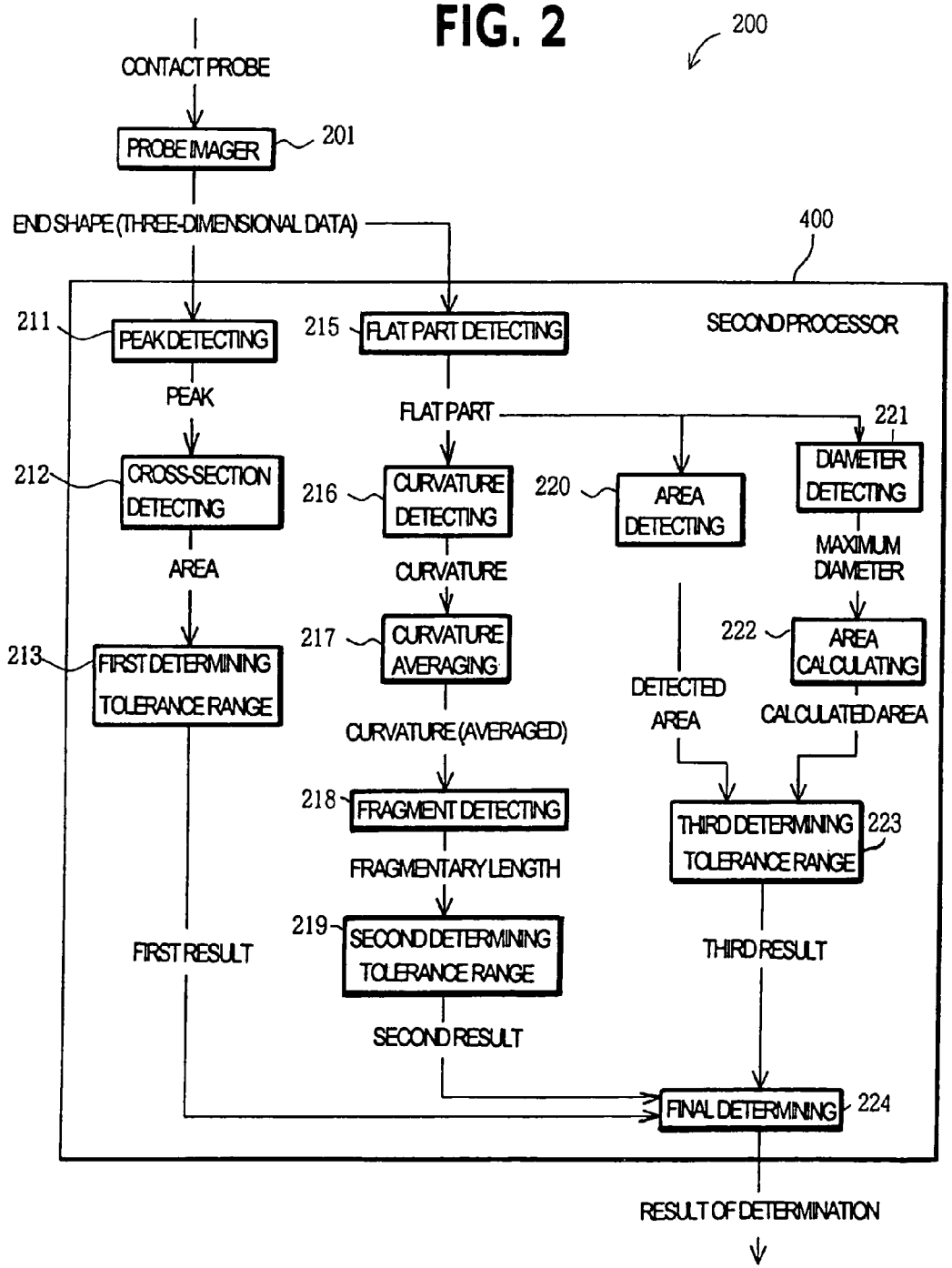

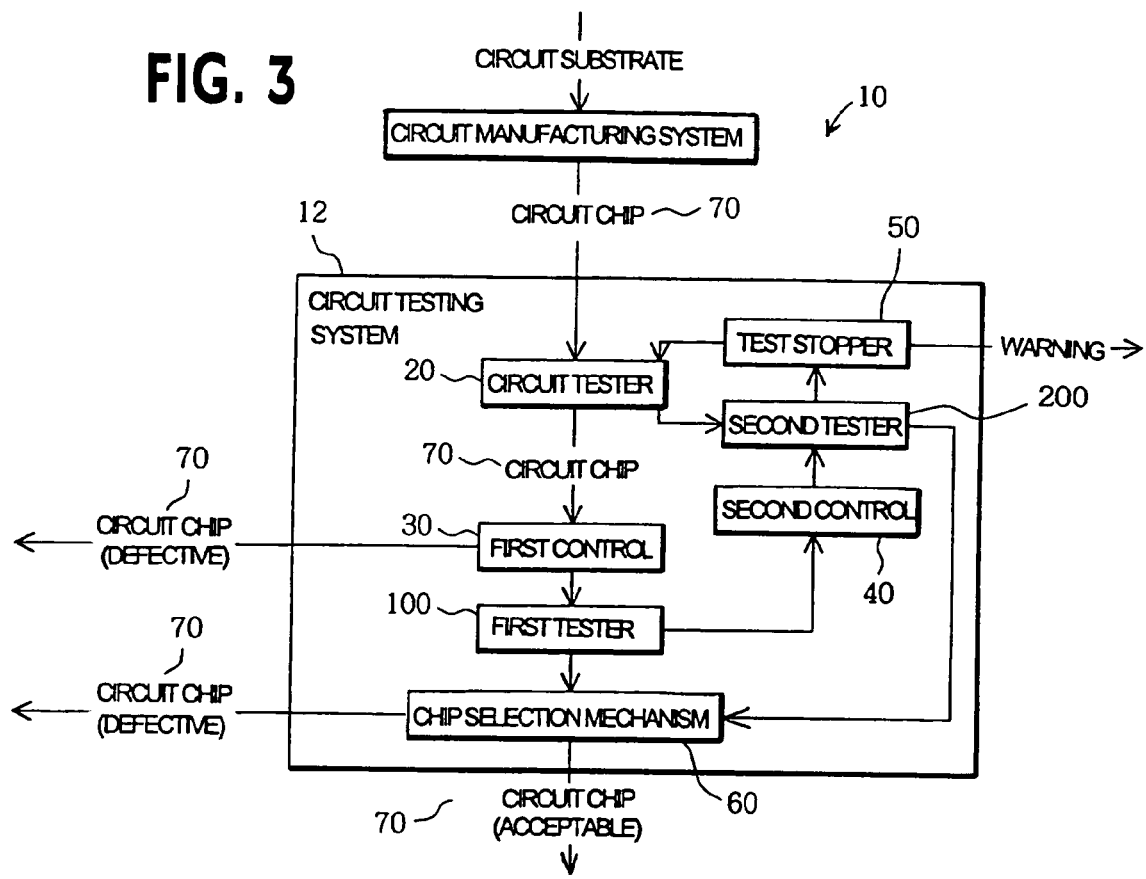
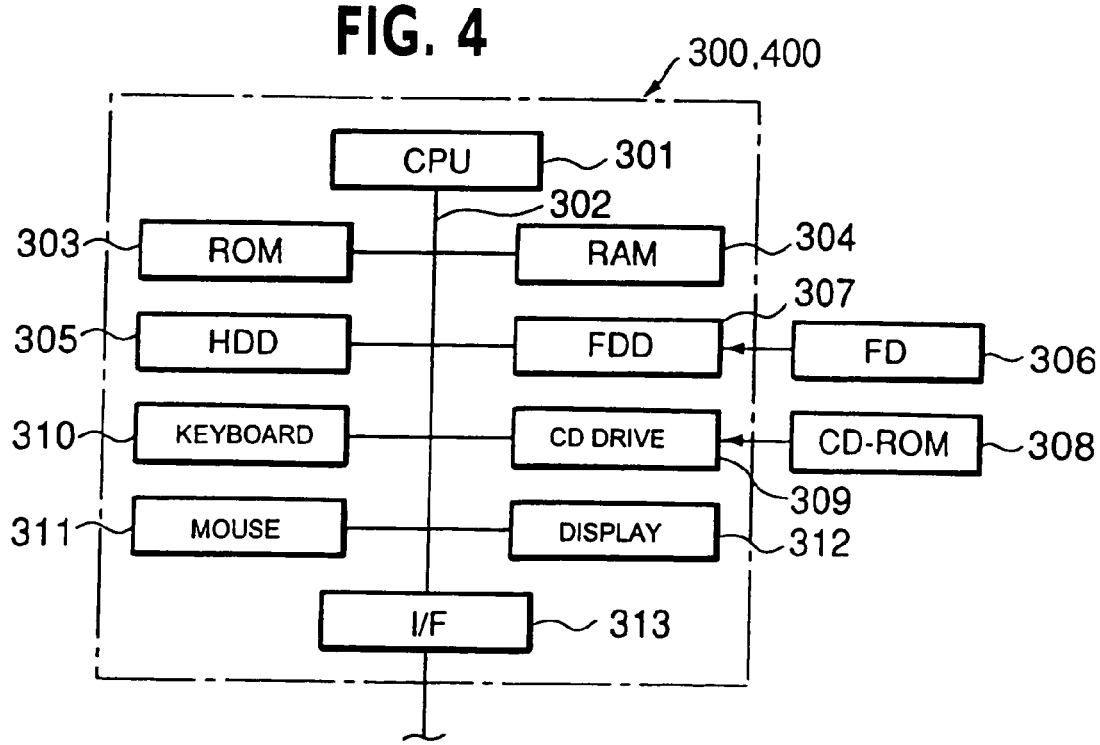

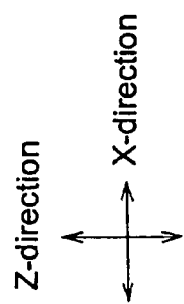
FIG. 7a
FIG. 7b
FIG. 7c
FIG. 7d
FIG. 7e
FIG. 7f
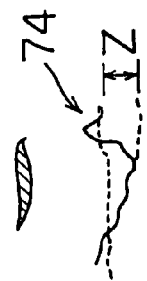
FIG. 7g

PROBE TESTING METHOD AND APPARATUS FOR DETERMINING ACCEPTABLE/DEFECTIVE END SHAPE OF CONTACT PROBE THROUGH IMAGE ANALYSIS

BACKGROUND OF THE INVENTION

1. Field of the Invention

The present invention relates to a probe testing method and apparatus for testing the shape of a leading end of a contact probe which is in pressure contact with a contact pad on an integrated circuit.

2. Description of the Related Art

At present, in the field of manufacturing circuit chips, each of which has an integrated circuit formed on a circuit substrate, a test is conducted for the integrated circuits in the manufactured circuit chips to see whether they are acceptable or defective. One of such tests involves bringing a leading end of a contact probe into pressure contact with the surface of a contact pad on an integrated circuit, and electrically determining from the contact probe whether the integrated circuit is acceptable or defective.

Generally, since an integrated circuit has a multiplicity of contact pads arranged in a predetermined pattern, a probe card having a multiplicity of contact probes arranged in correspondence to the contact pads is used for the aforementioned test. As such a probe card is brought into pressure contact with an integrated circuit, the multiplicity of probes are individually brought into pressure contact with the multiplicity of contact pads.

The contact probe as described above is made of a fine metal needle which has a leading end in such a shape that is optimal for conduction to a contact pad. Actually, however, the end shape of the contact probe can be inappropriate due to manufacturing variations, wear and the like, occasionally causing destruction of a contact pad if it is brought into pressure contact with such an inappropriate contact probe.

To prevent the destruction of contact pads, some probe testing apparatuses conduct a test after the end shape of contact probes has been manufactured or while the contact probes are in use. Such probe testing apparatuses are classified into a type which detects electric characteristics of contact probes, and a type which tests contact probes for their end shapes.

Methods of testing the end shape of a contact probe are further classified into a method of testing the end shape from the impression of a contact pad with which the contact probe is brought into pressure contact, and a method of directly testing the end shape of a contact probe. In the following, these testing methods will be outlined as representative prior art examples.

The first probe testing method for testing the end shape of a contact probe from the impression of a contact pad first scans the surface shape of the contact pad with which the contact probe is brought into pressure contact to read three-dimensional data of the surface shape.

For example, when the surface of the contact pad is parallel with the XY-directions, the three-dimensional data representing the surface shape has a multiplicity of X-direction main scanning lines arranged in the Y-direction, and represents irregularities in the Z-direction in its X-direction main scanning lines.

Next, for removing noise components from the read or scanned surface shape, the surface shape is partitioned into a dot matrix which extends in the XY-directions, and averages the depth of each dot in the Z-direction, for example, together with the depths of eight surrounding dots.

Then, from the averaged surface shape, recesses having a predetermined depth or more are extracted, and one having a predetermined area or more is selected from a plurality of extracted recesses. Since the impression of the contact probe is detected in this way, it is determined from at least one of the depth, position and shape of the impression whether the contact probe is acceptable or defective.

On the other hand, the second probe testing method for directly testing the end shape of a contact probe first images the end shape of the contact probe from an axial direction to read three-dimensional data of the end shape, and detects flat parts perpendicular to the axial direction from the imaged end shape.

This imaging relies on optical characteristics to detect only flat parts, and a level difference between the imaged flat parts is represented by interference fringes. Therefore, the level difference between the flat parts is calculated from the interference fringes to determine whether the contact probe is acceptable or defective depending on whether or not the level difference falls within a predetermined tolerance range.

Further, a third probe testing method for directly testing the end shape of a contact probe detects a flat part of the contact probe in a manner similar to the aforementioned approach, detects a maximum diameter and a minimum diameter from the detected flat part, and determines whether or not the contact probe is acceptable or defective depending on whether or not the ratio of the detected maximum diameter to minimum diameter falls within a predetermined tolerance range.

A fourth probe testing method for directly testing the end shape of a contact probe detects a flat part of the contact probe in a manner similar to the aforementioned approach, detects a maximum diameter and a perimeter from the detected flat part, and determines whether or not the contact probe is acceptable or defective depending on whether or not the ratio of the detected maximum diameter to perimeter falls within a predetermined tolerance range.

The first probe testing method described above relies on the surface shape of a contact pad to detect the impression of a contact probe from the depth and area of a recess, so that it can successfully detect the impression of the contact probe when the contact pad exhibits a high smoothness on the surface.

At present, however, over-wet-etching may be performed as appropriate to improve the contact property, in which case the etching advances in the direction of the grain boundary of aluminum which is the material for the contact pad, resulting in random miniature irregularities on the surface of the contact pad.

In addition, since the irregularities are similar to the impression of the contact probe in dimensions and shape, the first probe testing method fails to accurately detect the impression of a contact probe from the surface of an over-wet-etched contact pad.

The second probe testing method in turn relies on the level difference between flat parts to determine whether a contact probe is acceptable or defective, so that a defective contact probe will be determined as acceptable, for example, even if miniature bumps are found on the flat parts.

The third probe testing method in turn relies on the ratio of the maximum diameter to the minimum diameter of a flat part at the leading end of a contact probe to determine whether the contact probe is acceptable or defective, so that a defective contact probe even having an extremely distorted surface shape of the flat part will be determined as acceptable if there is a small difference between the maximum diameter and minimum diameter.

Finally, the fourth probe testing method relies on the ratio of the maximum diameter to the perimeter of a flat part at the leading end of a contact probe to determine whether the contact probe is acceptable or defective, so that even a good contact probe only having fine irregularities on the perimeter of the flat part, for example, will be determined as defective if the irregularities extend over a long distance to cause a long perimeter.

SUMMARY OF THE INVENTION

It is an object of the present invention to provide a probe testing apparatus which is capable of accurately determining whether a contact probe is acceptable or defective.

A first probe testing apparatus according to the present invention includes pad scanning means, surface averaging means, part extracting means, reference generating means, recess detecting means, recess selecting means, recess enlarging means, impression detecting means, shape detecting means, and probe determining means, for testing the shape of the leading end of a contact pad which is brought into pressure contact with a contact pad on an integrated circuit.

The pad scanning means scans the surface shape of the contact pad in pressure contact with the contact probe to read three-dimensional data of the surface shape, and the surface averaging means averages the read surface shape. The part extracting means differentiates the read surface shape to extract a multiplicity of flat parts, and the reference generating means complements the multiplicity of extracted flat parts to generate a reference shape. The recess detecting means subtracts the generated reference shape from the read surface shape to detect a plurality of recesses having a predetermined depth or more, and the recess selecting means for selecting one from the plurality of detected recesses corresponding to reference information. The recess enlarging means enlarges the selected recess outward by predetermined dimensions, and the impression detecting means subtracts the reference shape from the surface shape read at the position of the enlarged recess to detect an impression of the contact probe. The shape detecting means detects at least one of a depth, a position and a shape of the detected impression, and the probe determining means determines from at least one of the detected depth, position and shape of the impression whether the contact probe is acceptable or defective.

Consequently, the probe testing apparatus according to the present invention can precisely detect the impression of the contact probe from the surface shape of the contact pad even if the contact pad is formed with miniature irregularities on the surface to determine without fail whether the end shape of the contact probe is acceptable or defective from at least one of the depth, position and shape of the impression.

A second probe testing apparatus according to the present invention includes probe imaging means, peak detecting means, cross-section detecting means, and probe determining means, wherein the probe imaging means images the end shape of a contact probe in the axial direction to read three-dimensional data of the end shape. The peak detecting means detects a peak of the contact probe in the axial direction from the imaged end shape, and the cross-section detecting means detects a cross-sectional area of the contact probe at a position retraced by a predetermined distance in the axial direction from the detected peak. The probe determining means determines whether the contact probe is acceptable or defective depending on whether or not the detected cross-sectional area falls within a predetermined tolerance range, thereby enabling the probe testing apparatus to precisely determine whether the end shape of the contact probe is acceptable or defective based on the cross-sectional area at the position the predetermined distance away from the peak.

A third probe testing apparatus according to the present invention includes probe imaging means, flat part detecting means, curvature detecting means, curvature averaging means, fragment detecting means, and probe determining means, wherein the probe imaging means images the end shape of a contact probe from the axial direction to read three-dimensional data of the end shape. The flat part detecting means detects a flat part perpendicular to the axial direction from the imaged end shape, and the curvature detecting means sequentially detects curvatures along a contour of the detected flat part. The curvature averaging means individually averages a multiplicity of detected curvatures, and the fragment detecting means detects a fragmentary length of the contour over which the detected curvature falls within a predetermined abnormal range. The probe determining means determines whether the contact probe is acceptable or defective depending on whether or not the ratio of a total of the detected fragmentary lengths to the overall length of the contour falls within a predetermined tolerance range, thereby enabling the probe testing apparatus to precisely determine from the curvature along the contour of the flat part whether the end shape of the contact probe is acceptable or defective.

A fourth probe testing apparatus according to the present invention includes probe imaging means, flat part detecting means, area detecting means, diameter detecting means, area calculating means, and probe determining means, wherein the probe imaging means images the end shape of a contact probe from the axial direction to read three-dimensional data of the end shape. The flat part detecting means detects a flat part perpendicular to the axial direction from the imaged end shape, and the area detecting means detects the area of the detected flat part. The diameter detecting means detects a maximum diameter of the detected flat part, and the area calculating means calculates the area of the flat part from the detected diameter. The probe determining means determines whether the contact probe is acceptable or defective depending on whether or not the ratio of the detected area to the calculated area falls within a predetermined tolerance range, thereby enabling the probe testing apparatus to precisely determine from the relationship between the maximum diameter and area of the flat part included in the contact probe whether the end shape of the contact probe is acceptable or defective.

A fifth probe testing apparatus according to the present invention includes probe imaging means, peak detecting means, cross-section detecting means, first determining means, flat part detecting means, curvature detecting means, curvature averaging means, fragment detecting means, second determining means, area calculating means, diameter detecting means, area calculating means, third determining means, and final determining means wherein the probe imaging means images the end shape of a contact probe from the axial direction to read three-dimensional data of the end shape. The peak detecting means detects a peak of the contact probe in the axial direction from the imaged end shape, the cross-section detecting means detects a cross-sectional area of the contact probe at a position retraced by a predetermined distance in the axial direction from the detected peak, and then the first determining means determines whether the contact probe is acceptable or defective depending on whether or not the detected cross-sectional area falls within a predetermined tolerance range. The flat part detecting means detects a flat part perpendicular to the axial direction from the imaged end shape, and the curvature detecting means sequentially detects curvatures along a contour of the detected flat part. The curvature averaging means individually averages a multiplicity of detected curvatures, the fragment detecting means detects a fragmentary length of the contour over which the detected curvature falls within a predetermined abnormal range, and then second determining means determines whether the contact probe is acceptable or defective depending on whether or not the ratio of a total of the detected fragmentary lengths to the overall length of the contour falls within a predetermined tolerance range. The area detecting means detects the area of the detected flat part, and the diameter detecting means detects a maximum diameter of the detected flat part. Then, the area calculating means calculates the area of the flat part from the detected diameter, and the third determining means determines whether the contact probe is acceptable or defective depending on whether or not the ratio of the detected area to the calculated area falls within a predetermined tolerance range. The final determining means definitely determines that the contact probe is defective when at least one of the first determining means, the second determining means, and the third determining means determines that the contact probe is defective.

Accordingly, the probe testing apparatus according to the present invention determines whether the end shape of the contact probe is acceptable or defective based on the cross-sectional area of the contact probe at a position the predetermined distance away from the peak thereof, based on the curvature of the flat part, and further based on the relationship between the maximum diameter and area of the flat part, and can definitely determine that the contact probe is defective when it is so determined by any of the three criteria.

A sixth probe testing apparatus according to the present invention includes probe imaging means, peak detecting means, cross-section detecting means, first determining means, flat part detecting means, curvature detecting means, curvature averaging means, fragment detecting means, second determining means, area detecting means, diameter detecting means, area calculating means, and third determining means, wherein the probe imaging means images the end shape of a contact probe from the axial direction to read three-dimensional data of the end shape. The peak detecting means detects a peak of the contact probe in the axial direction from the imaged end shape, the cross-section detecting means detects a cross-sectional area of the contact probe at a position retraced by a predetermined distance in the axial direction from the detected peak, and then the first determining means determines whether the contact probe is acceptable or defective depending on whether or not the detected cross-sectional area falls within a predetermined tolerance range. The flat part detecting means detects a flat part perpendicular to the axial direction from the imaged end shape, and the curvature detecting means sequentially detects curvatures along a contour of the detected flat part. The curvature averaging means individually averages a multiplicity of detected curvatures, the fragment detecting means detects a fragmentary length of the contour over which the detected curvature falls within a predetermined abnormal range, and then second determining means determines whether the contact probe is acceptable or defective depending on whether or not the ratio of a total of the detected fragmentary lengths to the overall length of the contour falls within a predetermined tolerance range. The area detecting means detects the area of the detected flat part, and the diameter detecting means detects a maximum diameter of the detected flat part. Then, the area calculating means calculates the area of the flat part from the detected diameter, and the third determining means determines whether the contact probe is acceptable or defective depending on whether or not the ratio of the detected area to the calculated area falls within a predetermined tolerance range. The final determining means definitely determines that the contact probe is defective when two of the first determining means, the second determining means, and the third determining means determine that the contact probe is defective.

Accordingly, the probe testing apparatus according to the present invention determines whether the end shape of the contact probe is acceptable or defective based on the cross-sectional area of the contact probe at a position the predetermined distance away from the peak thereof, based on the curvature of the flat part, and further based on the relationship between the maximum diameter and area of the flat part, and can definitely determine that the contact probe is defective when it is so determined by two of the three criteria.

A seventh probe testing apparatus according to the present invention includes probe imaging means, peak detecting means, cross-section detecting means, first determining means, flat part detecting means, curvature detecting means, curvature averaging means, fragment detecting means, second determining means, area detecting means, diameter detecting means, area calculating means, and third determining means, wherein the probe imaging means images the end shape of a contact probe from the axial direction to read three-dimensional data of the end shape. The peak detecting means detects a peak of the contact probe in the axial direction from the imaged end shape, the cross-section detecting means detects a cross-sectional area of the contact probe at a position retraced by a predetermined distance in the axial direction from the detected peak, and then the first determining means determines whether the contact probe is acceptable or defective depending on whether or not the detected cross-sectional area falls within a predetermined tolerance range. The flat part detecting means detects a flat part perpendicular to the axial direction from the imaged end shape, and the curvature detecting means sequentially detects curvatures along a contour of the detected flat part. The curvature averaging means individually averages a multiplicity of detected curvatures, the fragment detecting means detects a fragmentary length of the contour over which the detected curvature falls within a predetermined abnormal range, and then second determining means determines whether the contact probe is acceptable or defective depending on whether or not the ratio of a total of the detected fragmentary lengths to the overall length of the contour falls within a predetermined tolerance range. The area detecting means detects the area of the detected flat part, and the diameter detecting means detects a maximum diameter of the detected flat part. Then, the area calculating means calculates the area of the flat part from the detected diameter, and the third determining means determines whether the contact probe is acceptable or defective depending on whether or not the ratio of the detected area to the calculated area falls within a predetermined tolerance range. The final determining means definitely determines that the contact probe is defective when all of the first determining means, the second determining means, and the third determining means determine that the contact probe is defective.

Accordingly, the probe testing apparatus according to the present invention determines whether the end shape of the contact probe is acceptable or defective based on the cross-sectional area of the contact probe at a position the predetermined distance away from the peak thereof, based on the curvature of the flat part, and further based on the relationship between the maximum diameter and area of the flat part, and can definitely determine that the contact probe is defective when it is so determined by all of the three criteria.

A variety of means referred to in the present invention need only be formed to carry out functions intended therefor, and may be implemented by dedicated hardware which performs predetermined functions, a data processing apparatus which is provided with predetermined functions through a computer program, predetermined functions carried out by a data processing apparatus through a computer program, a combination of these, or the like.

Also, a variety of means referred to in the present invention need not be individually independent resources, but a plurality of means can be formed as a single member, certain means can be part of another means, part of certain means can be identical to part of another means, and the like.

A data processing apparatus referred to in the present invention may be any hardware resource which is capable of reading a computer program to execute corresponding processing operations, and may be, for example, a CPU (Central Processing Unit) based hardware which is connected to a variety of devices such as ROM (Read Only Memory), RAM (Random Access Memory), I/F (Interface) unit, and the like. It should be noted that in the present invention, causing a data processing apparatus to execute a variety of operations corresponding to a computer program also means that the data processing apparatus is commanded to control the operation of a variety of devices.

An information storage medium referred to in the present invention may be any hardware resource which has previously stored thereon a computer program for causing a data processing apparatus to execute a variety of processing, and may be implemented, for example, by ROM and HDD (Hard Disc Drive) fixedly mounted in the data processing apparatus, CD (Compact Disc)-ROM and FD (Flexible Disc-cartridge) exchangeably loaded in the data processing apparatus, and the like.

BRIEF DESCRIPTION OF THE DRAWINGS

FIG. 2 is a schematic block diagram illustrating the logical structure of a second tester which represents a second probe testing apparatus according to one embodiment of the present invention;

FIG. 3 is a schematic block diagram illustrating the physical structure of a circuit manufacturing line;

FIG. 4 is a block diagram illustrating the physical structure of a first processor and a second processor which represent the data processing apparatus;

FIGS. 7(a) to 7(g) are schematic diagrams showing main scanning lines in a processing step of detecting an impression from the surface shape of the contact pad;

DETAILED DESCRIPTION OF THE PREFERRED EMBODIMENTS

Configuration of Embodiment

Figure 1:
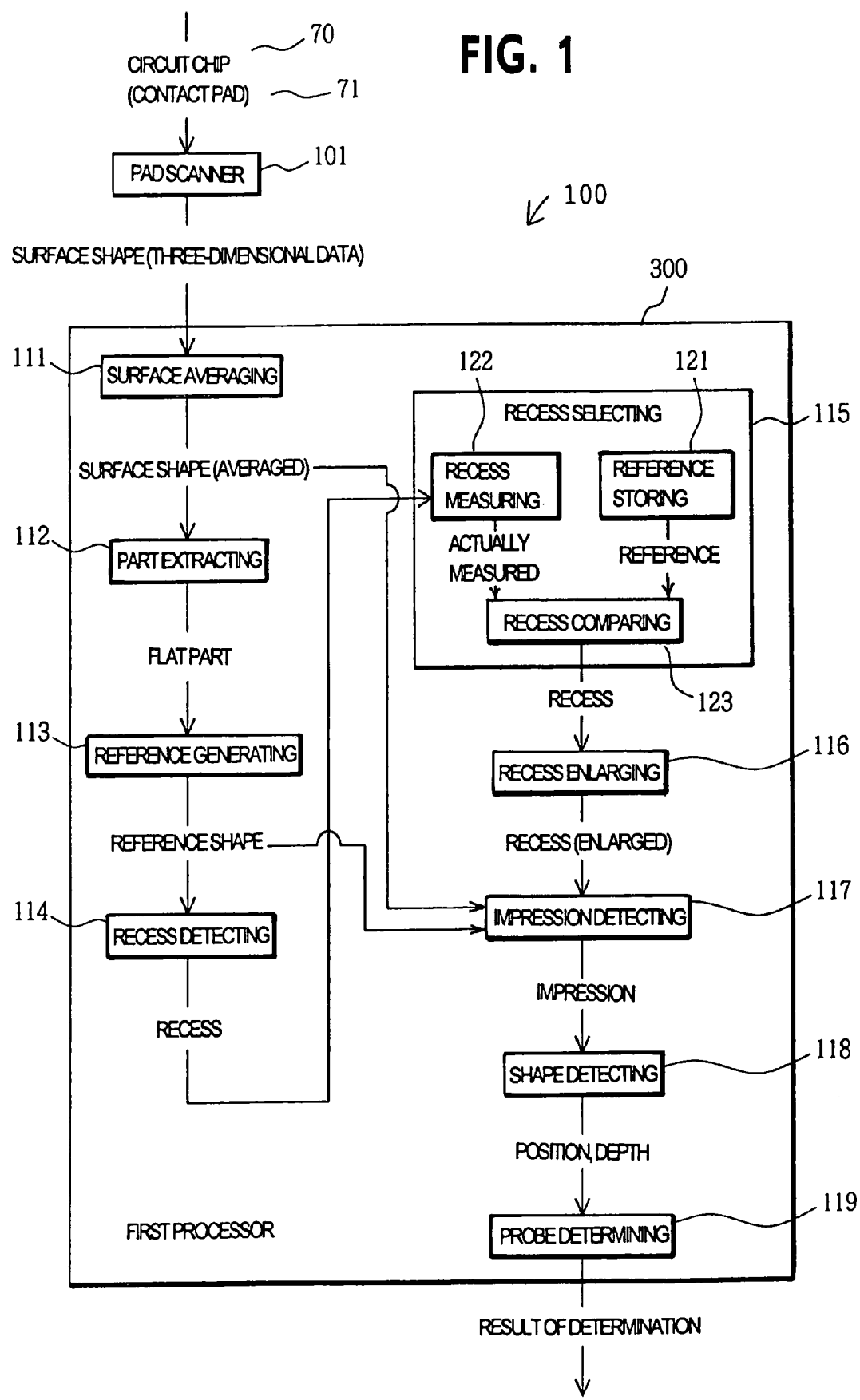
FIG. 1 is a schematic block diagram illustrating the logical structure of a first tester which represents a first probe testing apparatus according to one embodiment of the present invention.

One embodiment of the present invention will hereinafter be described with reference to the accompanying drawings. Circuit manufacturing line 10 in this embodiment comprises circuit manufacturing system 11 and circuit testing system 12, as illustrated in FIG. 3. Circuit testing system 12 comprises circuit tester 20 which is a circuit testing means; first control function 30; first tester 100 which represents a probe testing apparatus; second control function 40; second tester 200 which represents a probe testing apparatus; test stopper 50 which is a test stopping means; chip selection mechanism 60 which is a chip selecting means; and the like.

Circuit manufacturing system 11, which comprises, for example, a CVD (Chemical Vapor Deposition) apparatus, a photolithography apparatus, and the like (not shown), forms an integrated circuit (not shown) having contact pads 71 on circuit substrate 72 to manufacture circuit chip 70.

Figure 5A:
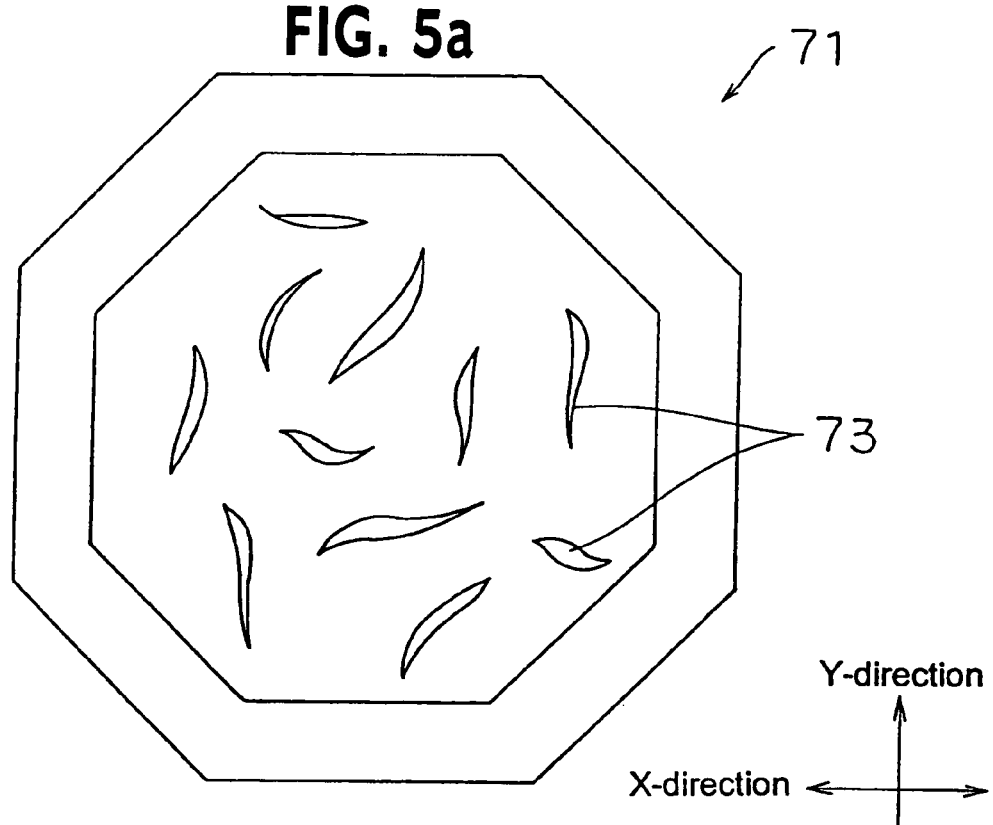
FIGS. 5(a) and 5(b) are plan views each illustrating the surface shape of a contact pad.

As can be seen in FIG. 5(a), circuit manufacturing system 11 performs over-wet-etching for improving the contact properties of contact pad 71, so that contact pad 71 has the surface formed with randomly shaped miniature irregularities 73 in the direction in which the grain boundary of aluminum, which is the material for contact pad 71, extends.

Circuit tester 20 is exchangeably mounted with a probe card (not shown) which has a multiplicity of contact probes 21 arranged in correspondence to the positions of a multiplicity of contact pads 71 on circuit chip 70. The leading end of each contact probe 21 is brought into pressure contact with associated contact pad 71 to electrically test whether the integrated circuit is acceptable or defective.

Figure 6:
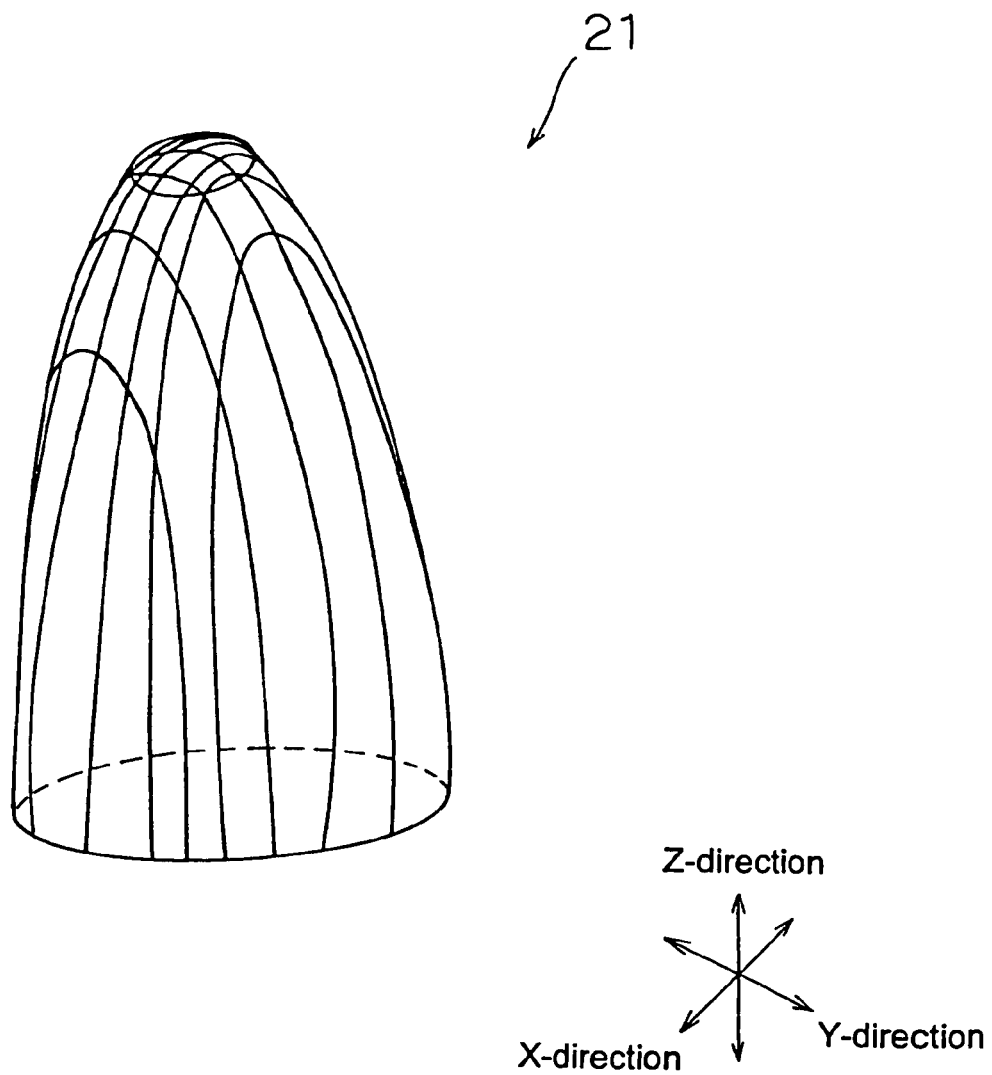
FIG. 6 is a perspective view illustrating the end shape of a contact probe.

As can be seen in FIG. 6, contact probe 21 has the leading end formed in acute dome, and its leading end face is polished to be flat in order to prevent contact probe 21 from destroying an insulating layer below contact pad 71 while improving its contact properties. It should be noted however that in such contact probe 21, the leading end face may not be polished to be flat in some cases.

First control function 30, which comprises, for example, a computer system connected to circuit tester 20 and first tester 100, a robot arm (not shown), and the like, discards circuit chip 70 which has an integrated circuit determined by circuit tester 20 as defective, and carries circuit chip 70 determined as acceptable into first tester 100 to determine whether contact probe 21 is acceptable or defective.

As illustrated in FIG. 1, first tester 100 comprises pad scanner 101 which is a pad scanning means, and first processor 300 which represents a data processing apparatus. Though details will be described later, pad scanner 101 scans the surface shape of contact pad 71, which is in pressure contact with contact probe 21, to read three-dimensional data of the surface shape, and first processor 102 relies on the surface shape to determine whether contact probe 21 is acceptable or defective as it is brought into pressure contact with contact pad 71.

Second control function 40, which comprises, for example, a computer system (not shown) connected to first tester 100 and second tester 200, and the like instructs second tester 200 to test contact probe 21 which is determined as defective by first tester 100.

As illustrated in FIG. 2, second tester 200 comprises probe imager 201 which is a probe imaging means, and second processor 400 which represents a data processing apparatus. Though details will be described later, probe imager 201 images the end shape of contact probe 21 which is determined as defective by first tester 100 from the axial direction to read three-dimensional data of the end shape, and second processor 400 relies on the imaged end shape to determine whether contact probe 21 is acceptable or defective.

Test stopper 50, which comprises, for example, a computer system (not shown) connected to second tester 200 and circuit tester 20, and the like, temporarily stops circuit tester 20 when first tester 100 determines that contact probe 21 is defective, and instructs second tester 200 to test the thus determined contact probe 21.

When second tester 200 again determines that contact probe 21 is defective, test stopper 50 completely shuts down circuit tester 20, and generates a warning which indicates that contact probe 21 is defective, which may be displayed on a display unit (not shown) as a guidance.

Chip selection mechanism 60, which comprises, for example, a computer system (not shown) connected to second tester 200, a robot arm (not shown), and the like, determines circuit chip 70 as defective and accordingly discards circuit chip 70, if it has contact pad 71 in pressure contact with contact probe 21 that has been determined as defective again by second tester 200.

For example, when circuit chips 70 are carried one by one into circuit testing system 12, defective circuit chips 70 are also discarded one by one. On the other hand, when silicon wafer (not shown) formed integrally with a multiplicity of circuit chips 70 is carried into circuit testing system 12, defective circuit chips 70 alone are discarded after the silicon wafer is singulated into respective circuit chips 70.

As illustrated in FIG. 3, first processor 300 in first tester 100 comprises CPU 301, as a main hardware component of the computer, which is interconnected through bus line 302 with hardware components such as ROM 303, RAM 304, HDD 305, FDD 307 exchangeably loaded with FD 306, CD drive 309 exchangeably loaded with CD-ROM 308, keyboard 310, mouse 311, display 312, I/F unit 313, and the like.

Since first processor 300 and second processor 400 are identical in the physical configuration of hardware described above, and only differ in the logical configuration of software, later described, hardware components of first processor 300 and second processor 400 will be designated the same names and reference numerals in the following description.

In first processor 300 in this embodiment, the hardware components such as ROM 303, RAM 304, HDD 305, exchangeable FD 306, exchangeable CD-ROM 308, and the like correspond to information storage media, at least one of which stores computer programs and resources for CPU 301 as software.

Such software has been previously installed in first processor 300, and is read by CPU 301 upon start of first processor 300. Since CPU 301 reads an appropriate computer program in this way to execute a variety of processing, first processor 300 of this embodiment logically comprises a variety of functions such as surface averaging function 111, part extracting function 112, reference generating function 113, recess detecting function 114, recess selecting function 115, recess enlarging function 116, impression detecting function 117, shape detecting function 118, probe determining function 119, and the like, as a variety of means.

The foregoing variety of functions 111–119 correspond to functions of CPU 301 for executing predetermined data processing corresponding to a computer program stored in RAM 304 of first processor 300. Surface averaging function 111 averages the surface shapes of contact pads 71 which are read or scanned by pad scanner 101.

More specifically, circuit tester 20 holds circuit chip 70 such that the surface of contact pad 71 is in parallel with the X-direction and Y-direction, as illustrated in FIG. 5, and brings contact probe 71 into pressure contact with contact pad 71 from the Z-direction. Since pad scanner 101 scans or reads the surface shape of contact pad 71 to generate a multiplicity of X-direction scanning lines arranged in the Y-direction, the X-direction scanning lines of the surface shape represent irregularities in the Z-direction, as illustrated in FIG. 7(a).

Thus, surface averaging function 111 partitions the surface shape composed of a multiplicity of X-direction scanning lines, arranged in the Y-direction, into a dot matrix which extends in the XY-directions, and averages the depth of each dot in the Z-direction together with the depths of eight surrounding dots, thereby smoothing the three-dimensional data of the surface shape in the Z-direction, as illustrated in FIG. 7(b).

As illustrated in FIG. 7(c), part extracting function 112 differentiates the surface shape averaged by surface averaging function 111 to extract a multiplicity of flat parts. As illustrated in FIG. 7(d), reference generating function 113 complements the multiplicity of flat parts extracted by part extracting function 112 to generate a reference shape.

Recess detecting function 114 subtracts the reference shape in FIG. 7(d) from the surface shape in FIG. 7(b) to detect a plurality of recesses having a predetermined depth or more, as illustrated in FIG. 7(e). Recess selecting function 115 selects one from the plurality of recesses detected by recess detecting function 114 corresponding to the reference information.

More specifically, as illustrated in FIG. 1, recess selecting function 115 comprises reference storing function 121, recess measuring function 122, and recess comparing function 123. Reference storing function 121 stores an X-direction length, a Y-direction length, and an area in the XY-directions as the reference information.

Figure 5B:
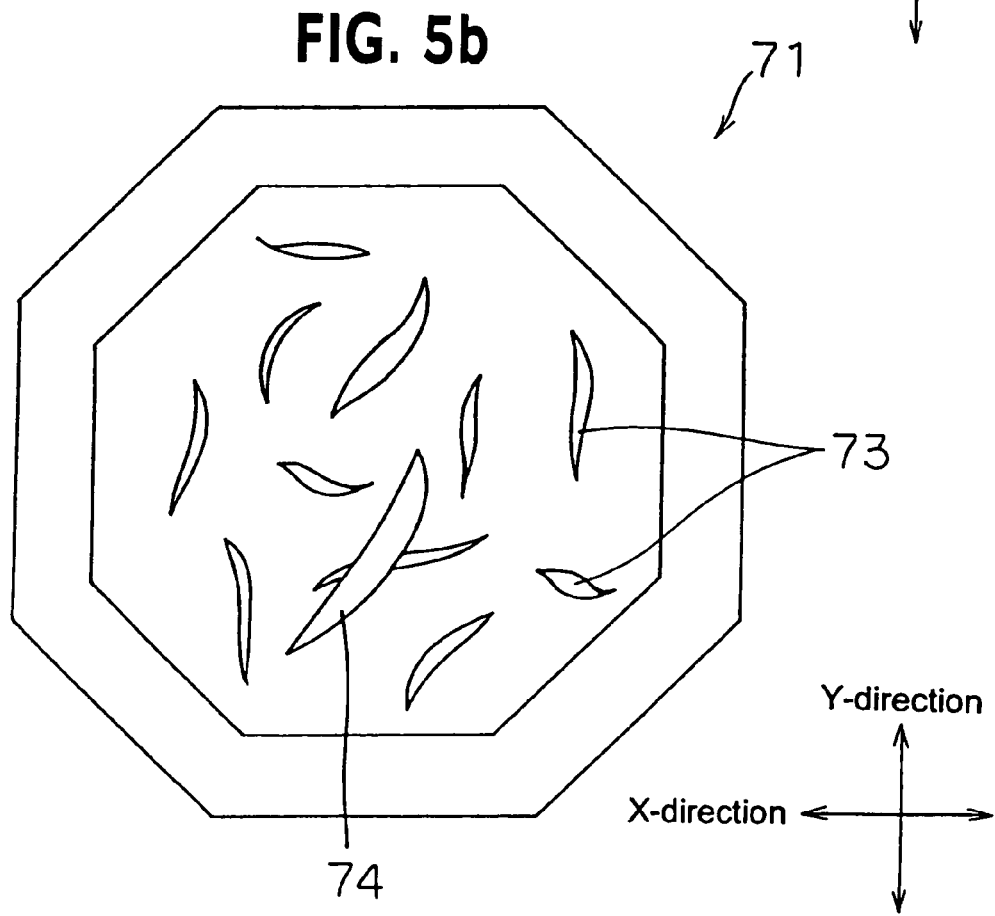

Recess measuring function 122 detects the X-direction length, Y-direction length, and area in the XY-directions for each of the plurality of recesses as actually measured information. Recess comparing function 123 selects a recess which has the actually measured information that presents the X-direction length, Y-direction length, and area that exceed their counterparts in the reference information. As illustrated in FIG. 5(b), the reference information is set in correspondence to impression 74 formed on contact pad 71 by contact probe 21, so that recess selecting function 115 selects one recess corresponding to impression 74 from the plurality of recesses, as illustrated in FIG. 7(f).

Recess enlarging function 116 enlarges the one recess selected by recess selecting function 115 outward by predetermined dimensions. Impression detecting function 117 subtracts the reference shape in FIG. 7(d) from the surface shape in FIG. 7(a) at the position of the recess enlarged by recess enlarging function 116 to detect impression 74 of contact probe 21, as illustrated in FIG. 7(g).

Shape detecting function 118 detects the position in the XY-directions, and the depth in the Z-direction of impression 74 detected by impression detecting function 117. Probe determining function 119 compares the depth and position of impression 74 detected by shape detecting function 118 with respective predetermined tolerance ranges to determine whether contact probe 21 is acceptable or defective.

On the other hand, as illustrated in FIG. 2, second processor 400 of this embodiment logically comprises a variety of functions such as peak detecting function 211, cross-section detecting function 212, first determining function 213, flat part detecting function 215, curvature detecting function 216, curvature averaging function 217, fragment detecting function 218, second determining function 219, area detecting function 220, diameter detecting function 221, area calculating function 22, third determining function 223, final determining function 224, and the like as a variety of means.

Likewise, the foregoing variety of functions 211–224 correspond to functions of CPU 301 for executing predetermined data processing corresponding to a computer program stored in RAM 304 of second processor 400. Peak detecting function 211 detects the peak in the axial direction from the end shape of contact probe 21 which is imaged by probe imager 201.

More specifically, since probe imager 201 images the end shape of contact probe 21 from the Z-direction, which is the axial direction, to read three-dimensional data of the end shape, this imaging relies on optical characteristics to detect only flat parts, and a level difference between the imaged flat parts is represented by interference fringes. Thus, peak detecting function 211 relies on the interference fringes to detect the peak from the imaged end shape, and sets the coordinates in the axial direction with reference to the position of the peak.

Cross-section detecting function 212 detects cross-sectional area "M" of contact probe 21 at a position retraced by predetermined distance "d" from the peak detected by peak detecting function 211 in the axial direction. First determining function 213 determines whether contact probe 21 is acceptable or defective depending on whether or not cross-sectional area "M" detected by cross-section detecting function 212 falls within a predetermined tolerance range.

Figure 9A:
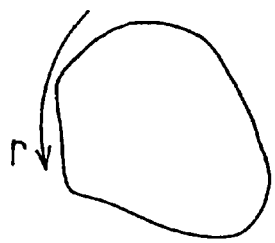
FIGS. 9(a) to 9(c) are schematic diagrams illustrating a processing step of detecting a linear portion from the end shape of the contact probe.
Figure 9B:
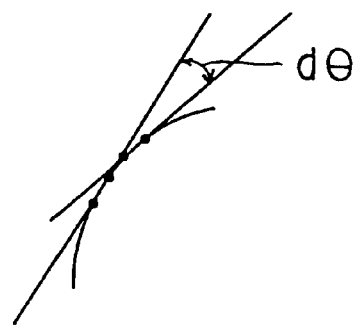

Since probe imager 201 characteristically images only a flat part of contact probe 21, average detecting function 215 detects the flat part as illustrated in FIG. 9(a). Curvature detecting function 261 detects the center of gravity of the flat part detected by flat part detecting function 215, and detects the curvature along the contour of the flat part of every predetermined angle about the center of gravity, as illustrated in FIG. 9(b).

Figure 9C:
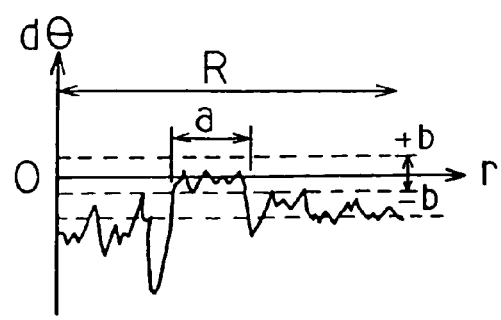

Curvature averaging function 217 averages each of a number of curvatures detected by curvature detecting function 216 with the preceding and subsequent curvatures. Fragment detecting function 218 detects a fragmentary contour length "a" over which curvature "dθ" averaged by curvature averaging function 217 falls within predetermined abnormal range "±b," as illustrated in FIG. 9(c).

The abnormal range "±b" is centered at "0," and a line segment having a curvature of "0" refers to a straight line, so that fragment detecting function 218 detects a linear portion of the contour. Second determining function 219 calculates the ratio of the total of a plurality of fragmentary lengths "a" detected by fragment detecting function 218 to overall length "R" of the contour, and determines whether contact probe 21 is acceptable or defective depending on whether or not the ratio falls within a predetermined tolerance range.

Area detecting function 220 detects the area of the flat part detected by flat part detecting function 215, while diameter detecting function 221 detects a maximum diameter of the flat part detected by flat part detecting function 215. Area calculating function 222 calculates the area of the flat part from the diameter detected by diameter detecting function 221. Third determining function 223 determines whether contact probe 21 is acceptable or defective depending on whether or not the ratio of the area detected by area detecting function 220 to the area calculated by area calculating function 222 falls within a predetermined tolerance range.

Final determining function 224 receives the determination results from first determining function 213, second determining function 219, and third determining function 223, respectively, and definitely determines contact probe 21 as defective when contact probe 21 is determined as defective in at least one of the determination results.

A variety of functions performed by first processor 300 and second processor 400 may be implemented with the aid of hardware components such as HDD 305, I/F unit 313 and the like as required, whereas their core is implemented by CPU 301 which is a hardware component that functions corresponding to a computer program stored in an information storage medium such as RAM 304 or the like.

Such a computer program associated with first processor 300 is stored, for example, in an information storage medium such as RAM 304 or the like as software for causing CPU 301 and the like to execute such processing operations as the surface averaging processing for averaging the surface shape of contact pad 71 read or scanned by pad scanner 101; part extraction processing for differentiating the averaged surface shape to extract a multiplicity of flat parts; reference generation processing for complementing a multiplicity of extracted flat parts to generate a reference shape; recess detection processing for subtracting the reference shape from the averaged surface shape to detect a plurality of recesses having a predetermined depth or more; recess measurement processing for detecting the X-direction length, Y-direction length, and area in the XY-directions for each of the plurality of recesses as actually measured information; recess comparison processing for selecting a recess which has the X-direction length, Y-direction length, and area, consisting the actually measured information, exceeding their counterparts in the reference information; recess enlargement processing for enlarging the one selected recess outward by predetermined dimensions; impression detection processing for subtracting the reference shape from the read or scanned surface shape at the position of the enlarged recess to detect impression 74 of contact probe 21; shape detection processing for detecting the position in the XY-directions and the depth in the Z-direction of detected impression 74; probe determination processing for comparing the detected depth and position of the impression with respective predetermined tolerance ranges to determine whether contact probe 21 is acceptable or defective; and the like.

On the other hand, a computer program associated with second processor 400 is stored, for example, in an information storage medium such as RAM 304 or the like as software for causing CPU 301 and the like to execute such processing operations as the peak detection processing for detecting the peak in the axial direction from the end shape of contact probe 21 imaged by probe imager 201; cross-section detection processing for detecting cross-sectional area "M" of contact probe 21 at a position retraced by predetermined distance "d" in the axial direction from the detected peak; first determination processing for determining whether contact probe 21 is acceptable or defective depending on whether or not detected cross-sectional area "M" falls within a predetermined tolerance range; flat part detection processing for detecting a flat part imaged by probe imager 201; curvature detection processing for sequentially detecting curvatures of the contour of the detected flat part; curvature averaging processing for averaging each of a multiplicity of detected curvatures with the preceding and subsequent curvatures; fragment detection processing for detecting the length of linear portion of the contour over which the averaged curvature falls within a predetermined abnormal range; second determination processing for determining whether contact probe 21 is acceptable or defective depending on whether or not the ratio of the total of a plurality of detected fragmentary lengths to the overall length of the contour falls within a predetermined tolerance range; area detection processing for detecting the area of the flat part imaged by probe imager 201; diameter detection processing for detecting a maximum diameter of the flat part imaged by probe imager 201; area calculation processing for calculating the area of the flat part from the detected diameter; third determination processing for determining whether contact probe 21 is acceptable or defective depending on whether or not the ratio of the detected area to the calculated area falls within a predetermined tolerance range; final determination processing for definitely determining contact probe 21 as defective when contact probe 21 is determined as defective in at least one of the three determination results; and the like.

Operation of Embodiment

In circuit manufacturing line 10 in this embodiment configured as described above, circuit manufacturing system 11 forms an integrated circuit having a multiplicity of contact pads 71 on circuit substrate 72 to manufacture circuit chip 70, and circuit tester 20 electrically tests the integrated circuit in circuit chip 70 to determine whether it is acceptable or defective.

In this event, since a multiplicity of contact pads 71 are arranged in a predetermined pattern on the integrated circuit in circuit chip 70, circuit tester 20 brings a probe card having a multiplicity of contact probes 21 arranged in a predetermined pattern into contact with circuit chip 70 such that each of the multiplicity of contact pads 71 is in pressure contact with a corresponding one of the multiplicity of contact probe 21.

Figure 10:
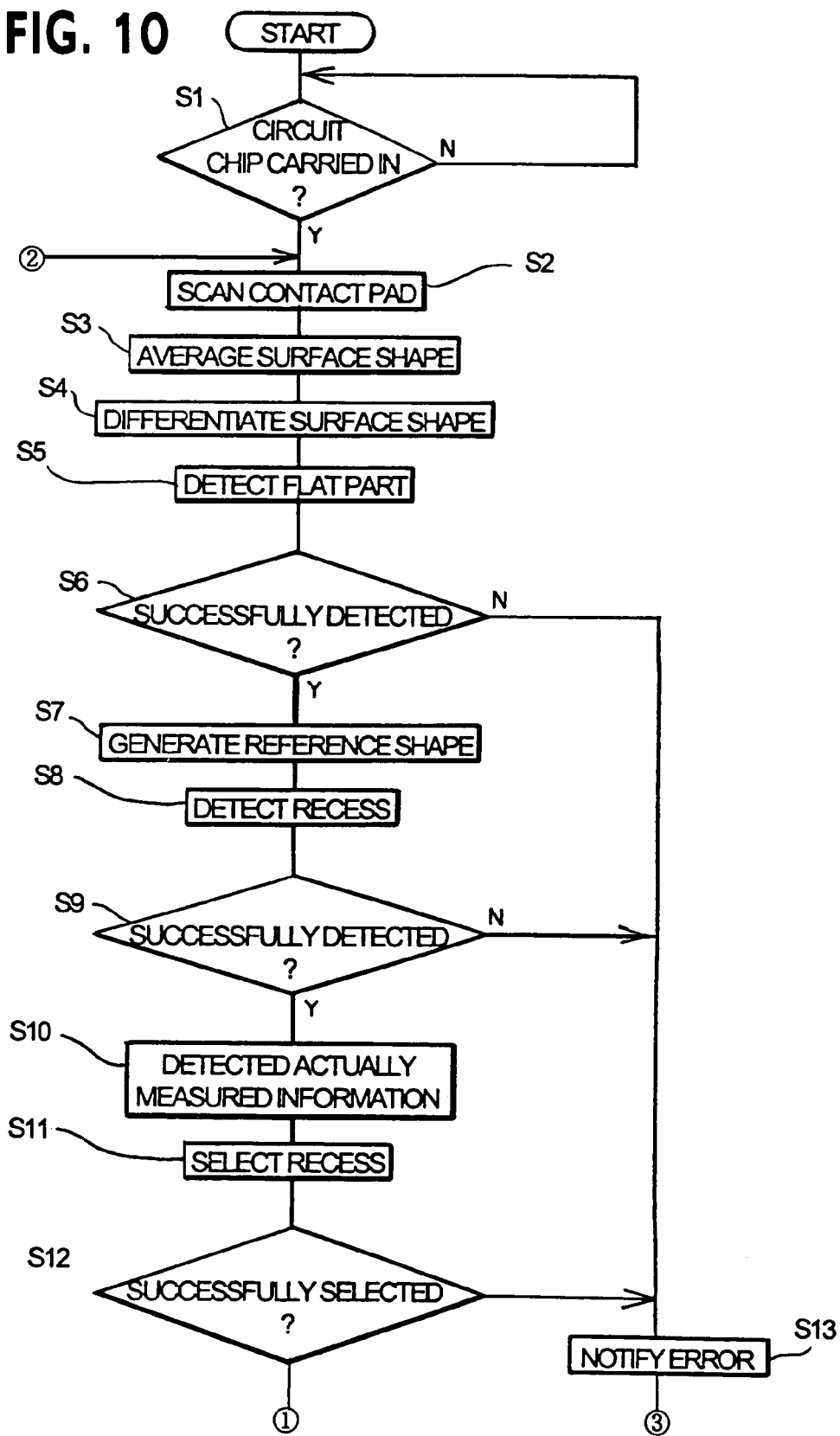
FIG. 10 is a flow chart illustrating the former half of a data processing method performed by the first processor.

Circuit chip 70 having an integrated circuit determined as defective by circuit tester 20 is discarded, while circuit chip 70 determined as acceptable is carried into first tester 100. As illustrated in FIG. 10, first tester 100 selects one from a multiplicity of contact pads 71 of circuit chip 70 carried therein, and pad scanner 101 scans the surface shape of the selected contact pad 71 to read thee-dimensional data of the surface shape (steps S1, S2).

As first processor 300 is applied with the surface shape of contact pad 71 scanned by pad scanner 101, first processor 300 partitions the surface shape of contact pad 71 into a dot matrix arranged in the X- and Y-directions, and averages the depth in the Z-direction of each dot together with the depths of surrounding eight dots to smooth the three-dimensional data of the surface shape in the Z-direction, as illustrated in FIGS. 7(*a*), 7(*b*) (step S3).

Next, as illustrated in FIG. 7(*c*), first processor 300 differentiates the averaged surface shape to extract a multiplicity of flat parts (steps S4, S5), and complements the multiplicity of extracted flat parts to generate a reference shape, as illustrated in FIG. 7(*d*) (step S7). This complementation may involve, for example, connecting a multiplicity of sporadically extracted flat parts through smoothing to complement gaps therebetween, thereby generating a continuous reference shape.

Next, first processor 300 subtracts the generated reference shape in FIG. 7(*d*) from the surface shape in FIG. 7(*b*) to detect a plurality of recesses which have a predetermined depth or more, as illustrated in FIG. 7(*e*) (step S8), detects the X-direction length, Y-direction length, and area in the XY-directions for each of the plurality of recesses as actually measured information (step S9).

Next, first processor 300 reads the reference information which includes the X-direction length, Y-direction length, and area, and selects one recess which has the X-direction length, Y-direction length, and area, consisting the actually measured information, exceeding their counterparts in the reference information, as illustrated in FIG. 7(*f*) (step S11). As described above, since the reference information corresponds to impression 74 formed on contact pad 71 by contact probe 21, first processor 300 selects one recess corresponding to impression 74 from the plurality of recesses based on the reference information.

If no recess is selected, or if a plurality of recesses are selected, first processor 300 notifies the operator of an error by displaying a guidance message on display 312, and stops the operation (step S13). Likewise, when first processor 300 cannot detect the flat part (step S6), and when first processor 300 cannot detect a recess (step S9), first processor 300 notifies the operator of a similar error guidance and stops the operation (step S13).

Figure 11:
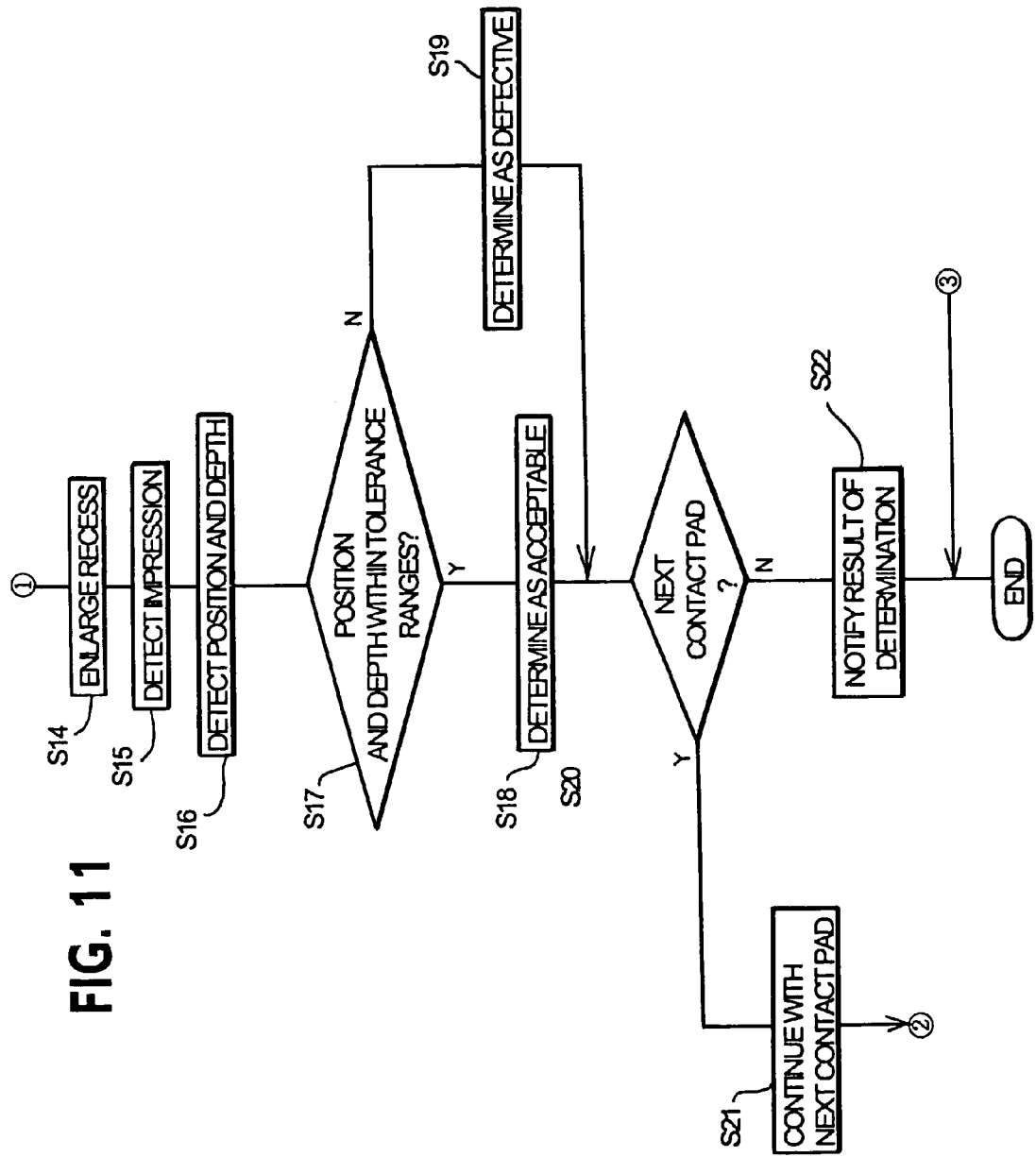
FIG. 11 is a flow chart illustrating the latter half of the data processing method.

When a single recess is selected as mentioned above, first processor 300 enlarges the selected recess outward by predetermined dimensions, as illustrated in FIG. 11 (step S14), and subtracts the reference shape in FIG. 7(*d*) from the surface shape in FIG. 7(*a*) at the position of the enlarged recess to detect impression 74 of contact probe 21, as illustrated in FIG. 7(*g*).

Next, first processor 300 detects the position in the XY-directions and the depth in the Z-direction of detected impression 74 (step S16), and determines contact probe 21, which has formed impression 74, as acceptable (step S18), if the depth and position of detected impression 74 fall within respective predetermined tolerance ranges (step S17). Conversely, if the depth and position of impression 74 do not fall within the predetermined tolerance ranges (step S17), first processor 300 determines contact probe 21 as defective (step S19).

The foregoing processing operations are performed for a multiplicity of contact pads 71 on circuit chip 70 on a one-by-one basis (steps S20, S21). When first processor 300 has determined all contact probes 21 as acceptable or defective with the aid of all contact pads 71, first tester 100 notifies second tester 200 of the result of the determination when even one contact probe 21 is determined as defective, and notifies chip selection mechanism 60 of the result of the determination when any contact probe 21 is not determined as defective (step S22).

When first tester 100 notifies chip selection mechanism 60 that all contact probes 21 are acceptable, chip selection mechanism 60 transports circuit chip 70 carried thereto to a predetermined path as an acceptable product. On the other hand, when first tester 100 notifies second tester 200 of any defective contact probe 21, second tester 200 directly tests contact probe 21 which has been determined as defective by first tester 100.

Figure 12:
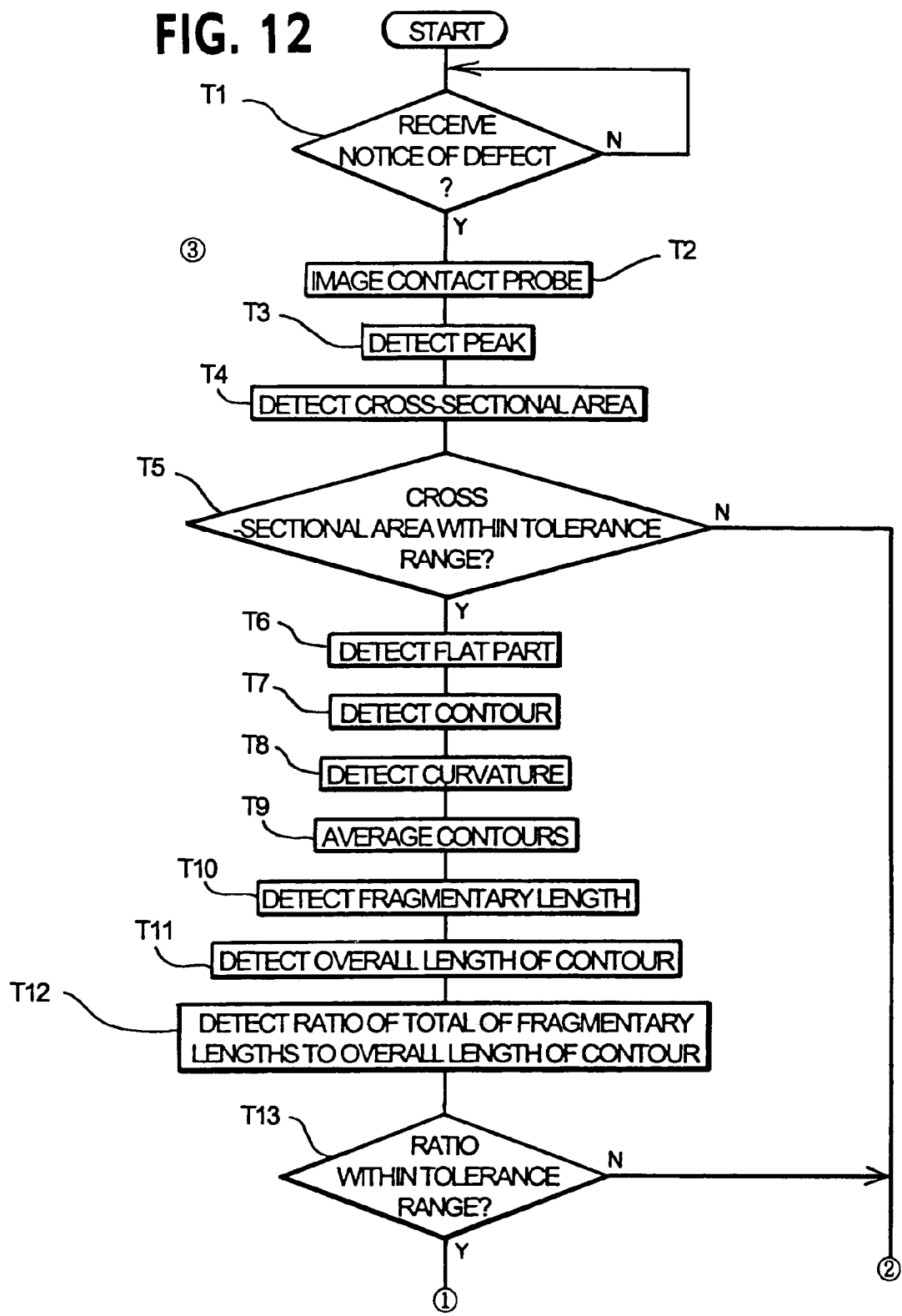
FIG. 12 is a flow chart illustrating the former half of a data processing method performed by the second processor.

More specifically, as illustrated in FIG. 12, as second tester 200 receives a notice of defect together with identification data for contact probe 21 from first tester 100 (step Ti), second tester 200 temporarily stops circuit tester 20 with the aid of test stopper 50, and instructs probe imager 201 to image the leading end of contact probe 21 corresponding to a probe card of circuit tester 20 from the axial direction (step T2).

Subsequently, second processor 400 detects a flat part from the end shape of contact probe 21 imaged as three-dimensional data, detects the peak from interference fringes on the captured image (step T3), and detects cross-sectional area "M" at a position retraced by predetermined distance "d" in the axial direction from the position of the peak (step T4).

Figure 13:
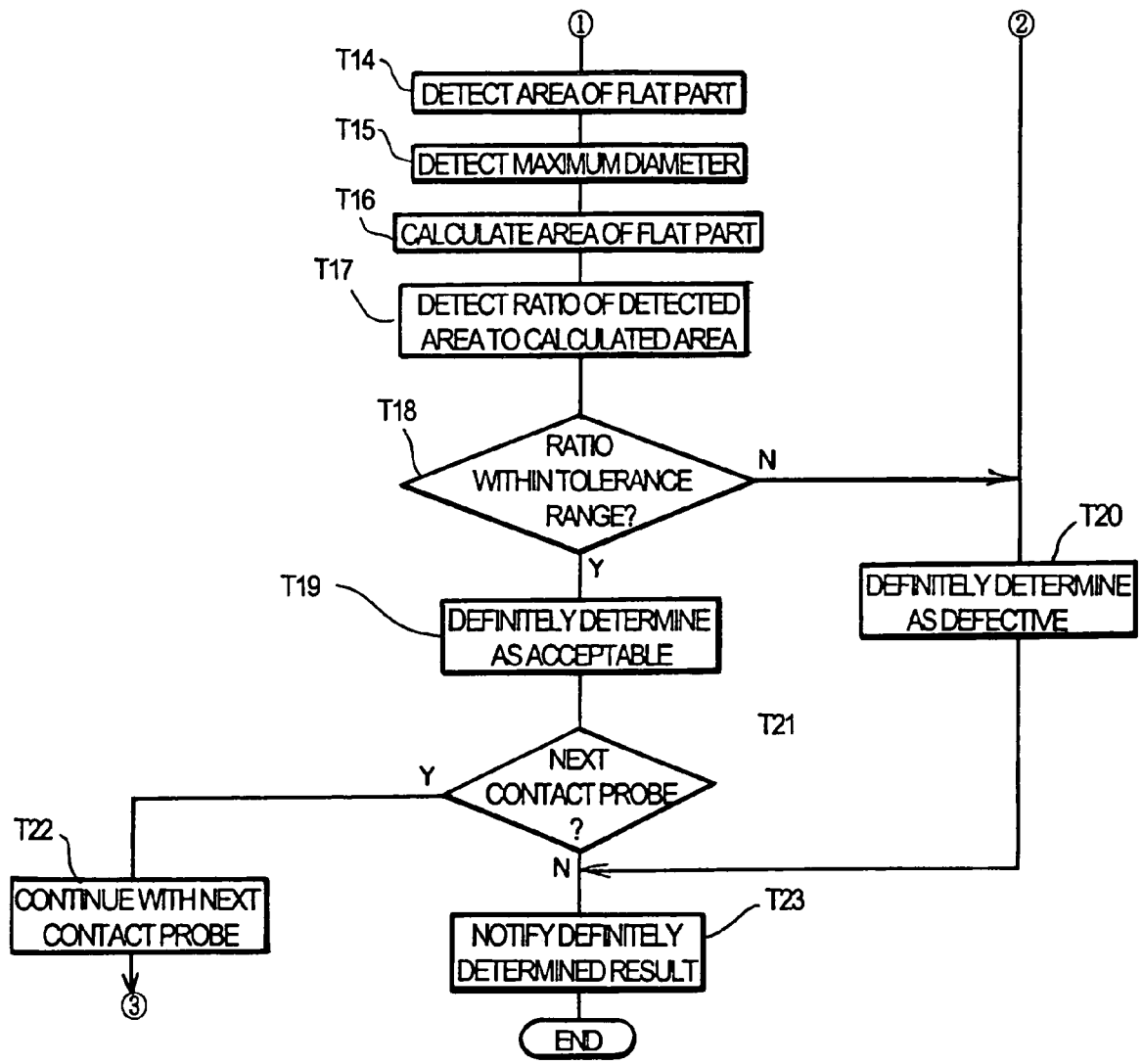
FIG. 13 is a flow chart illustrating the latter half of the data processing method.

Next, if detected cross-sectional area "M" does not fall within a predetermined tolerance range (step T5), second processor 400 determines contact probe 21 as defective (step T20), as illustrated in FIG. 13. In this event, as illustrated in FIG. 3, second tester 200 immediately notifies test stopper 50 and chip selection mechanism 60 of the definite result of the defect (step T23), causing chip selection mechanism 60 to discard circuit chip 70, with which defective contact probe 21 has been brought into pressure contact, as defective.

In addition, test stopper 50 completely shuts down circuit tester 20 in response to the notice of defect, and warns the operator of defective contact probe 21 through a guidance displayed on a display unit (not shown), thereby prompting the operator to perform appropriate maintenance operations (not shown) such as exchanging the probe card which has failed.

Also, as illustrated in FIG. 12, second processor 400 in circuit tester 20 proceeds to a second testing process using the captured image of contact probe 21 when the aforementioned cross-sectional area "M" falls within the predetermined tolerance range (step T5). In this event, second processor 400 detects a flat part of contact probe 21 imaged by probe imager 201 (step T6), and detects its contour (step T7).

Next, as illustrated in FIG. 9, second processor 400 sequentially detects the curvature along the contour of the flat part of every predetermined angle about the center of gravity of the flat part (step T8), and averages each of numerous curvatures together with the preceding and subsequent curvatures (step T9). Then, second processor 400 detects a fragmentary straight length "a" of the contour, over which averaged curvature "dθ" falls within predetermined abnormal range "±b" (step T10), and detects the overall length "R" of the contour (step T11).

Then, second processor 400 calculates the ratio of the total of a plurality of fragmentary lengths "a" to the overall length "R" of the contour (step T12), and definitely determines contact probe 21 as defective if the ratio does not fall within a predetermined tolerance range (step T13), and immediately notifies test stopper 50 and chip selection mechanism 60 of the definite result (step T23).

Conversely, if the ratio falls within the predetermined tolerance range (step T5), second processor 400 proceeds to a third testing process using the captured image of contact probe 21. In this event, as illustrated in FIG. 13, second processor 400 detects the area of the flat part of imaged contact probe 21 (step T14), detects a maximum diameter of the flat part (step T15), and calculates the area of the flat part from the maximum diameter (step T16).

Next, second processor 400 calculates the ratio of the detected area to the calculated area (step T17), definitely determines contact probe 21 as defective if the ratio does not fall within a predetermined tolerance range (step T18), as mentioned above, and immediately notifies test stopper 50 and chip selection mechanism 60 of the definite result (step T23).

Conversely, if the ratio falls within the predetermined tolerance range (step T18), second processor 400 definitely determines contact probe 21 as acceptable. Since the foregoing processing operations are performed for each of contact probes 21 determined as defective by first tester 100 (steps T21, T22), second processor 400 definitely determines the probe card as acceptable when all contact probes 21 under testing of the probe card are determined as acceptable, and notifies chip selection mechanism 60 and test stopper 50 to that effect.

In this event, test stopper 50 resumes the processing operation of circuit tester 20, which has been temporarily stopped, while chip selection mechanism 60 transports circuit chip 70 carried therein from first tester 100 to a predetermined pass as an acceptable product, permitting circuit testing system 12 to resume the testing operation for circuit chip 70.

Effects of Embodiment

As described above, in circuit manufacturing line 10 of the foregoing embodiment, when circuit testing system 12 sequentially tests circuit chips 70 sequentially manufactured by circuit manufacturing system 11, first tester 100 and second tester 200 can test contact probes 21 for defects which can cause defects of contact pads 71, in addition to a general electric test conducted by circuit tester 20 using a probe card, so that circuit testing system 12 can more strictly determine whether circuit chip 70 is acceptable or defective.

Particularly, first tester 100 indirectly tests the end shape of contact probe 21 for determining whether it is acceptable or defective from the surface shape of contact pad 71, while second tester 200 directly tests the end shape of contact probe 21 for determining whether it is acceptable or defective, thus enabling circuit testing system 12 to more successfully determine whether contact probe 21 is acceptable or defective.

Moreover, since first tester 100 has the ability to test all contact pads 71 in pressure contact with contact probes 21 in every circuit chip 70, circuit testing system 12 can prevent without fail defective circuit chip 70 from being taken out. And yet, since second tester 200 directly tests contact probe 21 determined as defective indirectly by first tester 100, circuit testing system 12 can determine without fail whether contact probe 21 is acceptable or defective with a high working efficiency.

Further, when first tester 100 determines even one contact probe 21 as defective, the transportation and test of circuit chips 70 are temporarily stopped, and when second tester 200 determines even one contact probe 21 as defective, the test of circuit chips 70 is completely stopped, and tested circuit chip 70 is discarded.

It is therefore possible to immediately prevent without fail defective circuit chips 70 from being taken out and to immediately stop manufacturing defective circuit chips 70 in volume without fail. Moreover, since the operator is warned of defective contact probe 21, the operator can immediately start appropriate maintenance operations such as exchange of a probe card, and the like.

Also, when second tester 200 determines all contact probes 21 as acceptable, the transportation and test of circuit chips 70 are resumed, thereby making it possible to immediately resume the test and transportation of circuit chips 70 when no problems are detected on contact probes 21.

Also, as illustrated in FIG. 7, first tester 100 scans the surface shape of contact pad 71 in pressure contact with contact probe 21 to read three-dimensional data of the surface shape, averages the scanned surface shape, differentiates the averaged surface shape to extract a multiplicity of flat parts, complements a multiplicity of the extracted flat parts to generate a reference shape, subtracts the generated reference shape from the averaged surface shape to detect a plurality of recesses having a predetermined depth or more, selects one from the plurality of detected recesses corresponding to the reference information, enlarges the selected recess outward by predetermined dimensions, subtracts the reference shape from the scanned surface shape at the position of the enlarged recess to detect impression 74 of contact probe 21, detects the depth and position of detected impression 74, and determines whether contact probe 21 is acceptable or defective from the detected depth and position of impression 74, thereby making it possible to precisely detect impression 74 of contact probe 21 from the surface shape of contact pad 74 and to correctly determine whether contact probe 21 is acceptable or defective from the depth and position of impression 74.

Particularly, the X-direction length, Y-direction length, and area are stored as reference information, and the X-direction length, Y-direction length, and area in the XY-directions are detected for each of a plurality of recesses as actually measured information. Since a selected recess has the actually measured information which presents the X-direction length, Y-direction length, and area that exceed their counterparts in the reference information, respectively, a recess representative of impression 74 of contact probe 21 can be readily selected with exactitude.

For example, in a conventional approach which involves only averaging the surface shape of contact pad 71, and selecting a recess which represents impression 74 through a comparison with reference information, impression 74 cannot be detected with a high accuracy if contact pad 71 is formed with miniature irregularities on the surface as illustrated in FIG. 5, whereas the aforementioned first tester 100 can accurately detect such rugged impression 74.

Second tester 200 in turn images the end shape of contact probe 21 from the axial direction with probe imager 201 to read three-dimensional data of the end shape, and determines from the imaged end shape whether contact probe 21 is acceptable or defective based on three types of methods. Thus, second tester 200 can make the determination at a high efficiency without fail.

Particularly, while the three types of probe testing methods employed by second tester 200 are intended for detection of different defects, second tester 200 definitely determines contact probe 21 as defective if contact probe 21 is so determined in any of the three results of the determinations, so that second tester 200 can appropriately test contact probes 21 for a variety of defects.

Specifically, the first probe testing method associated with second tester 200 detects the peak of contact probe 21 in the axial direction from the imaged end shape thereof, detects the cross-sectional area of contact probe 21 at a position retraced by a predetermined distance in the axial direction from the detected peak, and determines whether contact probe 21 is acceptable or defective depending on whether or not the detected cross-sectional area falls within a predetermined tolerance range. Thus, the first probe testing method can precisely determine, based on the cross-sectional area of contact probe 21 at the position the predetermined distance away from the peak thereof, whether contact probe 21 has a defective or acceptable end shape.

For example, in a conventional approach which determines whether contact probe 21 is acceptable or defective based on the level difference between the peak and flat part thereof, this approach would determine, as acceptable, contact probe 21 which includes bumps with small level differences on a flat part. The first method, on the other hand, can determine this contact probe 21 as defective.

The second probe testing method associated with second tester 200 detects a flat part of contact probe 21 perpendicular to the axial direction from the imaged end shape thereof, sequentially detects the curvature along the contour of the detected flat part, individually averages a multiplicity of detected curvatures, detects a fragmentary straight length of the contour over which the averaged curvature falls within a predetermined abnormal range, and determines whether contact probe 21 is acceptable or defective depending on whether or not the ratio of the total of a plurality of detected fragmentary lengths to the overall length of the contour falls within a predetermined tolerance range. Thus, the second method can precisely determine whether contact probe 21 has a defective or an acceptable end shape from the curvature along the contour of the flat part.

Figure 8A:
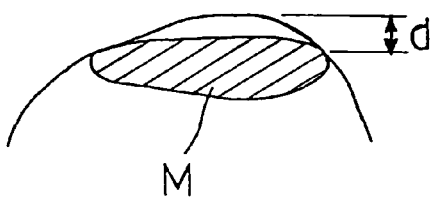
FIGS. 8(a) and 8(b) are perspective views each illustrating the end shape of a contact probe.
Figure 8B:
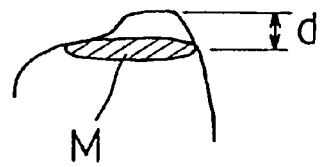

For example, in a conventional method which relies on the ratio of a maximum diameter to a minimum diameter to determine whether contact probe 21 is acceptable or defective, the method would determine, as acceptable, such defective contact probe 21 that has a small difference between the maximum diameter and minimum diameter even if its cross-sectional shape is extremely deformed, as illustrated in FIG. 8(b). The aforementioned second method, in contrast, can determine this contact probe 21 as defective.

The third probe testing method associated with second tester 200 detects a flat part perpendicular to the axial direction from the imaged end shape of contact probe 21, detects the area of the detected flat part, detects a maximum diameter of the detected flat part, calculates the area of the flat part from the detected diameter, and determines whether contact probe 21 is acceptable or defective depending on whether or not the ratio of the detected area to the calculated area falls within a predetermined tolerance range. Thus, the third method can precisely determine from the relationship between the maximum diameter and area of the flat part whether the end shape of contact probe 21 is acceptable or defective.

For example, in a conventional approach which relies on the ratio of a maximum diameter to a detected area to determine whether contact probe 21 is acceptable or defective, the method might determine, as defective, such acceptable contact probe 21 that has imperceivable irregularities in a peripheral region thereof. The aforementioned third method, in contrast, can determine this contact probe 21 as acceptable.

Exemplary Variations of Embodiments

The present invention is not limited to the foregoing embodiment, but permits a number of variations without departing from the spirit and scope of the invention. For example, while the foregoing embodiment has illustrated circuit testing system 12 which comprises both first tester 100 and second tester 200, circuit testing system 12 may comprise only one of them.

Also, while the foregoing embodiment has illustrated that first tester 100 tests all circuit chips 70 which have been electrically tested by circuit tester 20, first tester 100 can test only some of circuit chips 70 tested by circuit tester 20.

Further, while the foregoing embodiment has illustrated that second tester definitely determines as defective contact probe 21 which has been determined as defective by first tester 100, second tester 200 can test contact probes 21 on a periodic basis irrespective of the results of tests conducted by first tester 100. In addition, first tester 100 can test only those contact probes 21 which have been determined as defective by second tester 200.

While the foregoing embodiment has illustrated that second tester 200 employs three types of probe testing methods for determining whether contact probe 21 is acceptable or defective, the test can be conducted only with one or two typse of probe testing method. Further, in the foregoing embodiment, second tester 200 definitely determines contact probe 21 as defective when any of the three types of probe testing methods determines contact probe 21 as defective. Alternatively, contact probe 21 can be definitely determined as defective when all of the three types of probe testing methods determine contact probe 21 as defective, or contact probe 21 can be definitely determined as defective when two of the three types of probe testing methods determine contact probe 21 as defective.

Moreover, the foregoing embodiment has illustrated that first tester 100 averages the surface shape of contact pad 71 using surface averaging function 111 and differentiates the averaged surface shape using part extracting function 112, and second tester 200 averages the curvature along the contour of the end shape of contact probe 21 using curvature averaging function 217, and detects the fragmentary length using fragment detecting function 218.

Alternatively, first tester 100 can also directly differentiate the surface shape of contact pad 71 without averaging, and second tester 200 can also directly detect the fragmentary length without averaging the curvature along the contour of the end shape of probe 21.

Also, the foregoing embodiment has illustrated that CPU 301 operates in accordance with a computer program stored in RAM 304 or the like to logically implement a variety of means as a variety of functions of first processor 300. Alternatively, a variety of such functions can be implemented in proprietary hardware, or can be partially stored in RAM 304 or the like as software and partially implemented in hardware.

What is claimed is:

1. A probe testing apparatus for testing an end shape of a contact probe brought into pressure contact with a contact pad on an integrated circuit, said apparatus comprising:
    a detecting unit for detecting a surface shape of at least one of said contact pad and said contact probe as three-dimensional data;
    an analyzing unit for analyzing the surface shape through imaging; and
    a determining unitfor determining from the result of the analysis whether said contact probe is acceptable or defective;
    wherein said apparatus further comprises:
    a pad scanning unit for scanning the surface shape of said contact pad in surface shape;
    a part extracting unit for differentiating the read surface shape to extract a multiplicity of flat parts;
    a reference generating unit for complementing the multiplicity of extracted flat parts to generate a reference shape;
    a recess detecting unit for subtracting said generated reference shape from the read surface shape to detect a plurality of recesses having a predetermined depth or more;
    a recess selecting unit for selecting one from the plurality of detected recesses corresponding to reference information;
    an impression detecting unit for subtracting said reference shape from the read surface shape at the position of the selected recess to detect an impression of said contact probe;
    a shape detecting unit for detecting at least one of a depth, a position and a shape of the detected impression; and
    a probe determining unit for determining from at least one of the detected depth, position and shape of the impression whether said contact probe is acceptable or defective.

2. The probe testing apparatus according to claim 1, further comprising:
    a recess enlarging unit for enlarging the selected recess outward by predetermined dimensions;
    wherein said impression detecting unit subtracts said reference shape from the read surface shape at the position of the enlarged recess to detect an impression of said contact probe.

3. The probe testing apparatus according to claim 2, further comprising:
    a surface averaging unit for averaging the read surface shape;
    wherein said part extractin unit differentiates the averaged surface shape to extract a multiplicity of flat parts.

4. The probe testing apparatus according to claim 3, wherein:
    said pad scanning unit scans the shape of a surface of said contact pad in pressure contact with said contact probe from a Z-direction,
    said surface being parallel with an X-direction and a Y-direction; and
    said recess selecting unit comprises;
    a reference storing unit for storing an X-direction length, a Y-direction length, and an area in the XY-directions as said reference information;
    a recess measuring unit for detecting the X-direction length, the Y-direction length, and the area of each of said plurality of recesses as actually measured information;
    a recess comparing unit for selecting a recess which has the actually measured information that presents the X-direction length, the Y-direction length, and the area exceeding their counterparts in said reference information, respectively.

5. The probe testing apparatus according to claim 2, wherein:
    said pad scanning unit scans the shape of a surface of said contact pad in pressure contact with said contact probe from a Z-direction,
    said surface being parallel with an X-direction and a Y-direction; and said recess selecting unit comprises:
a reference storing unit for storing an X-direction length, a Y-direction length, and an area in the XY-directions as said reference information;
a recess measuring unit for detecting the X-direction length, the Y-direction length, and the area of each of said plurality of recesses as actually measured information; and
a recess comparing unit for selecting a recess which has the actually measured information that presents the X-direction length, the Y-direction length, and the area exceeding their counterparts in said reference information, respectively.

6. A probe testing apparatus for testing an end shape of a contact probe brought into pressure contact with a contact pad on an integrated circuit, said apparatus comprising:
a detecting unit for detecting a surface shape of at least one of said contact pad and said contact probe as three-dimensional data;
an analyzing unit for analyzing the surface shape through imaging; and
a determining unit for determining from the result of the analysis whether said contact probe is acceptable or defective;
wherein said apparatus further comprises:
a probe imaging unit for imaging the end shape of said contact probe from an axial direction to read three-dimensional data of the end shape;
a cross-section detecting unit for detecting a cross-sectional area of said contact probe at a predetermined position thereof from the imaged end shape; and
a probe determining unit for determining whether said contact probe is acceptable or defective depending on whether or not the detected cross-sectional area falls within a predetermined tolerance range.

7. The probe testing apparatus according to claim 6, further comprising:
a peak detecting unit for detecting a peak of said contact probe in the axial direction from the imaged end shape;
wherein said cross-section detecting unit detects cross-sectional area of said contact probe at a position retraced by a predetermined distance in the axial direction from the detected peak.

8. The probe testing apparatus according to claim 7, wherein
said probe determining unit corresponds to a first determining unit for determining whether said contact probe is acceptable or defective depending on whether or not the detected cross-sectional area falls within a predetermined tolerance range, and
said apparatus further comprising:
a flat part detecting unit for detecting a flat part perpendicular to the axial direction from the imaged end shape;
a curvature detecting unit for sequentially detecting curvatures along a contour of the detected flat part;
a fragment detecting unit for detecting a fragmentary length of the contour over which the detected curvature falls within a predetermined abnormal range;
a second determining unit for determining whether said contact probe is acceptable or defective depending on whether or not the ratio of a total of the detected fragmentary lengths to the overall length of the contour falls within a predetermined tolerance range;
an area detecting unit for detecting the area of the detected flat part;
a diameter detecting unit for detecting a maximum diameter of the detected flat part;
an area calculating unit for calculating the area of the flat part from the detected diameter;
third determining unit for determining whether said contact probe is acceptable or defective depending on whether or not the ratio of the detected area to the calculated area falls within a predetermined tolerance range; and
a final determining unit for definitely determining that said contact probe is defective when at least one of said first determining unit, said second determining unit, and said third determining unit determines that said contact probe is defective.

9. The probe testing apparatus according to claim 8, further comprising:
a curvature averaging unit for individually averaging a multiplicity of the detected curvature;
wherein said fragment detecting unit detects a fragmentary length of the contour over which the averaged curvature falls within a predetermined abnormal range.

10. The probe testing apparatus according to claim 9, wherein said final determining unit definitely determines that said contact probe is defective when two of said first determining unit, said second determining unit, and said third determining unit determine that said contact probe is defective.

11. The probe testing apparatus according to claim 9 wherein said final determining unit definitely determines that said contact probe is defective when all of said first determining unit, said second determining unit, and said third determining unit determine that said contact probe is defective.

12. The probe testing apparatus according to claim 8, wherein said final determining unit definitely determines that said contact probe is defective when two of said first determining unit, said second determining unit, and said third determining unit determine that said contact probe is defective.

13. The probe testing apparatus according to claim 8 wherein said final determining unit definitely determines that said contact probe is defective when all of said first determining unit, said second determining unit, and said third determining unit determine that said contact probe is defective.

14. A probe testing apparatus for testing an end shape of a contact probe brought into pressure contact with a contact pad on an integrated circuit, said apparatus comprising:
a detecting unit for detecting a surface shape of at least one of said contact pad and said contact probe as three-dimensional data;
an analyzing unit for analyzing the surface shape through imaging; and
a determining unit for determining from the result of the analysis whether said contact probe is acceptable or defective
wherein said apparatus further comprises:
a probe imaging unit for imaging an end shape of said contact probe from the axial direction to read three-dimensional data of the end shape;
a flat part detecting unit for detecting a flat part perpendicular to the axial direction from the imaged end shape;
a curvature detecting unit for sequentially detecting curvatures along a contour of the detected flat part;

a fragment detecting unit for detecting a fragmentary length of the contour over which the detected curvature falls within a predetermined abnormal range; and a probe determining unit for determining whether said contact probe is acceptable or defective depending on whether or not the ratio of a total of the detected fragmentary lengths to the overall length of the contour falls within a predetermined tolerance range.

15. The probe testing apparatus according to claim 14, further comprising:

a curvature averaging unit for individually averaging a multiplicity of the detected curvatures;

wherein said fragment detecting unit detects a fragmentary length of the contour over which the averaged curvature falls within a predetermined abnormal range.

16. A probe testing apparatus for testing an end shape of a contact probe brought into pressure contact with a contact pad on an integrated circuit, said apparatus comprising:

a detecting unit for detecting a surface shape of at least one of said contact pad and said contact probe as three-dimensional data;

an analyzing unit for analyzing the surface shape through imaging; and a determining unit for determining from the result of the analysis whether said contact probe is acceptable or defective wherein said apparatus further comprises:

a probe imaging unit for imaging an end shape of said contact probe from the axial direction to read three-dimensional data of the end shape;

a flat part detecting unit for detecting a flat part perpendicular to the axial direction from the imaged end shape;

an area detecting unit for detecting the area of the detected flat part;

a diameter detecting unit for detecting a maximum diameter of the detected flat part;

an area calculating unit for calculating the area of the flat part from the detected diameter; and a probe determining unit for determining whether said contact probe is acceptable or defective depending on whether or not the ratio of the detected area to the calculated area falls within a predetermined tolerance range.

17. A probe testing method for use with a probe testing apparatus for testing the shape of a leading end of a contact probe which is brought into pressure contact with a contact pad on an integrated circuit, said method comprising the steps of:

a detecting a surface shape of at least one of said contact pad and said contact probe as three-dimensional data;

an analyzing the surface shape through imaging; and a determining from the result of the analysis whether said contact probe is acceptable or defective the method further comprising:

a pad scanning step for scanning the surface shape of said contact pad in pressure contact with said contact probe to read three-dimensional data of the surface shape;

a part extracting step for differentiating the read surface shape to extract a multiplicity of flat parts;

a reference generating step for complementing the multiplicity of extracted flat parts to generate a reference shape;

a recess detecting step for subtracting said generated reference shape from the read surface shape to detect a plurality of recesses having a predetermined depth or more;

a recess selecting step for selecting one from the plurality of detected recesses corresponding to reference information;

an impression detecting step for subtracting said reference shape from the read surface shape at the position of the selected recess to detect an impression of said contact probe;

a shape detecting step for detecting at least one of a depth, a position and a shape of the detected impression; and a probe determining step for determining from at least one of the detected depth, position and shape of the impression whether said contact probe is acceptable or defective.

18. The probe testing method according to claim 17, further comprising:

a recess enlarging step for enlarging the selected recess outward by predetermined dimensions;

wherein, said impression detecting step subtracts said reference shape from the read surface shape at the position of the enlarged recess to detect an impression of said contact probe.

19. The probe testing method according to claim 18, further comprising:

a surface averaging step for averaging the read surface shape;

wherein said part extracting step differentiates the averaged surface shape to extract a multiplicity of flat parts.

20. A probe testing method for use with a probe testing apparatus for testing the share of a leading end of a contact probe which is brought into pressure contact with a contact pad on an integrated circuit, said method comprising the steps of:

a detecting a surface shape of at least one of said contact pad and said contact probe as three-dimensional data;

an analyzing the surface shape through imaging; and a determining from the result of the analysis whether said contact probe is acceptable or defective the method further comprising:

a probe imaging step for imaging the end shape of said contact probe from the axial direction to read three-dimensional data of the end shape;

a cross-section detecting step for detecting a cross-sectional area of said contact probe at a predetermined position from the imaged end shape; and a probe determining step for determining whether said contact probe is acceptable or defective depending on the detected cross-sectional area falls within a predetermined tolerance range.

21. The probe testing method according to claim 20, further comprising:

a peak detecting step for detecting a peak of said contact probe in the axial direction from the imaged end shape;

wherein said cross-section detecting step detects a cross-sectional area of said contact probe at a position retraced by a predetermined distance in the axial direction from the detected peak; and a probe determining step for determining whether said contact probe is acceptable or defective depending on whether or not the detected cross-sectional area falls within a predetermined tolerance range.

22. A probe testing method for use with a probe testing apparatus for testing the shape of a leading end of a contact probe which is brought into pressure contact with a contact pad on an integrated circuit, said method comprising the steps of:

a detecting a surface shape of at least one of said contact pad and said contact probe as three-dimensional data;

an analyzing the surface shape through imaging; and a determining from the result of the analysis whether said contact probe is acceptable or defective the method further comprising:

a probe imaging step for imaging an end shape of said contact probe from the axial direction to read three-dimensional data of the end shape;

a flat part detecting step for detecting a flat part perpendicular to the axial direction from the imaged end shape;

a curvature detecting step for sequentially detecting curvatures along a contour of the detected flat part;

a fragment detecting step for detecting a fragmentary length of the contour over which the detected curvature falls within a predetermined abnormal range; and a probe determining step for determining whether said contact probe is acceptable or defective depending on whether or not the ratio of a total of the detected fragmentary lengths to the overall length of the contour falls within a predetermined tolerance range.

23. The probe testing method according to claim 22, further comprising:

a curvature averaging step for individually averaging a multiplicity of the detected curvatures;

wherein said fragment detecting step detects a fragmentary length of the contour over which the averaged curvature falls within a predetermined abnormal range; and a probe determining step for determining whether said contact probe is acceptable or defective depending on whether or not the ratio of the total of the detected fragmentary lengths to the overall length of the contour falls within a predetermined tolerance range.

24. A probe testing method for use with a probe testing apparatus for testing the shape of a leading end of a contact probe which is brought into pressure contact with a contact pad on an integrated circuit, said method comprising the steps of:

a detecting a surface shape of at least one of said contact pad and said contact probe as three-dimensional data;

an analyzing the surface shape through imaging; and a determining from the result of the analysis whether said contact probe is acceptable or defective the method further comprising:

a probe imaging step for imaging an end shape of said contact probe from the axial direction to read three-dimensional data of the end shape;

a flat part detecting step for detecting a flat part perpendicular to the axial direction from the imaged end shape;

an area detecting step for detecting the area of the detected flat part;

a diameter detecting step for detecting a maximum diameter of the detected flat part;

an area calculating step for calculating the area of the flat part from the detected diameter; and a probe determining step for determining whether said contact probe is acceptable or defective depending on whether or not the ratio of the detected area to the calculated area falls within a predetermined tolerance range.

25. A data processing apparatus associated with a probe testing apparatus for determining whether a contact probe is acceptable or defective when said contact probe is in pressure contact with a contact pad on an circuit, said apparatus comprising:

an applying unit for applying a surface shape of at least one of said contact pad and said contact probe detected as three-dimensional data;

an analyzing unit for analyzing the surface shape through imaging; and a determining unit for determining from the result of the analysis whether said contact probe is acceptable or defective said apparatus further comprising:

a part extracting unit for differentiating the read surface shape to extract a multiplicity of flat parts;

a reference generating unit for complementing the multiplicity of extracted flat parts to generate a reference shape;

a recess detecting unit for subtracting said generated reference shape from the read surface shape to detect a plurality of recesses having a predetermined depth or more;

a recess selecting unit for selecting one from the plurality of detected recesses corresponding to reference information;

an impression detecting unit for subtracting said reference shape from the read surface shape at the position of the selected recess to detect an impression of said contact probe;

a shape detecting unit for detecting at least one of a depth, a position and a shape of the detected impression; and a probe determining unit for determining from at least one of the detected depth, position and shape of the impression whether said contact probe is acceptable or defective.

26. The data processing apparatus according to claim 25, further comprising:

a recess enlarging unit for enlarging the selected recess outward by predetermined dimensions;

wherein said impression detecting unit subtracts said reference shape from the read surface shape at the position of the enlarged recess to detect an impression of said contact probe.

27. The data processing apparatus according to claim 26, further comprising:

a surface averaging unit for averaging the surface shape which is scanned from said contact pad as three-dimensional data;

wherein said part extracting unit differentiates the averaged surface shape to extract a multiplicity of flat parts.

28. A data processing apparatus associated with a probe testing apparatus for determining whether a contact probe is acceptable or defective when said contact probe is in pressure contact with a contact pad on an integrated circuit, said apparatus comprising:

an applying unit for applying a surface shape of at least one of said contact pad and said contact probe detected as three-dimensional data;

an analyzing unit for analyzing the surface shape through imaging; and a determining unit for determining from the result of the analysis whether said contact probe is acceptable or defective said apparatus further comprising:

a cross-section detecting unit for detecting a cross-sectional area of said contact probe at a predetermined position thereof from the end shape imaged from said contact probe as three-dimensional data; and a probe determining unit for determining whether said contact probe is acceptable or defective depending on whether or not the detected cross-sectional area falls within a predetermined tolerance range.

29. The data processing apparatus according to claim 28, further comprising:
a peak detecting unit for detecting a peak of said contact probe in the axial direction from the end shape imaged from said contact probe as three-dimensional data;
wherein said cross-section detecting unit detects a cross-sectional area of said contact probe at a position retraced by a predetermined distance in the axial direction from the detected peak.

30. A data processing apparatus associated with a probe testing apparatus for determining whether a contact probe is acceptable or defective when said contact probe is in pressure contact with a contact pad on an integrated circuit, said apparatus comprising:
an applying unit for applying a surface shape of at least one of said contact pad and said contact probe detected as three-dimensional data;
an analyzing unit for analyzing the surface shape through imaging; and
a determining unit for determining from the result of the analysis whether said contact probe is acceptable or defective
said apparatus further comprising:
a flat part detecting unit for detecting a flat part perpendicular to the axial direction from the end shape imaged from said contact probe as three-dimensional data;
a curvature detecting unit for sequentially detecting curvatures along a contour of the detected flat part;
a fragment detecting unit for detecting a fragmentary length of the contour over which the detected curvature falls within a predetermined abnormal range; and
a probe determining unit for determining whether said contact probe is acceptable or defective depending on whether or not the ratio of a total of the detected fragmentary lengths to the overall length of the contour falls within a predetermined tolerance range.

31. The data processing apparatus according to claim 30, further comprising:
a curvature averaging unit for individually averaging a multiplicity of the detected curvatures;
wherein said fragment detecting unit detects a fragmentary length of the contour over which the averaged curvature falls within a predetermined abnormal range.

32. A data processing apparatus associated with a probe testing apparatus for determining whether a contact probe is acceptable or defective when said contact probe is in pressure contact with a contact pad on an integrated circuit, said apparatus comprising:
an applying unit for applying a surface shape of at least one of said contact pad and said contact probe detected as three-dimensional data;
an applying unit for applying the surface shape through imaging; and
a determining unit for determining from the result of the analysis whether said contact probe is acceptable or defective
said apparatus further comprising:
a flat part detecting unit for detecting a flat part perpendicular to the axial direction from the end shape imaged from said contact probe as three-dimensional data;
an area detecting unit for detecting the area of the detected flat part;
a diameter detecting unit for detecting a maximum diameter of the detected flat part;
an area calculating unit for calculating the area of the flat part from the detected diameter; and
a probe determining unit for determining whether said contact probe is acceptable or defective depending on whether or not the ratio of the detected area to the calculated area falls within a predetermined tolerance range.

33. A data processing method for use with a data processing apparatus associated with a probe testing apparatus for determining whether a contact probe is acceptable or defective when said contact probe is in pressure contact with a contact pad on an integrated circuit, said method comprising the steps of:
applying a surface shape of at least one of said contact pad and said contact probe detected as three-dimensional data;
analyzing the surface shape through imaging; and
determining from the result of the analysis whether said contact probe is acceptable or defective
the method further comprising:
a part extracting step for differentiating the read surface shape to extract a multiplicity of flat parts;
a reference generating step for complementing the multiplicity of extracted flat parts to generate a reference shape;
a recess detecting step for subtracting said generated reference shape from the read surface shape to detect a plurality of recesses having a predetermined depth or more;
a recess selecting step for selecting one from the plurality of detected recesses corresponding to reference information;
an impression detecting step for subtracting said reference shape from the read surface shape at the position of the selected recess to detect an impression of said contact probe;
a shape detecting step for detecting at least one of a depth, a position and a shape of the detected impression; and
a probe determining step for determining from at least one of the detected depth, position and shape of the impression whether said contact probe is acceptable or defective.

34. The data processing apparatus according to claim 33, further comprising:
a recess enlarging step for enlarging the selected recess outward by predetermined dimensions; wherein said impression detecting step subtracts said reference shape from the read surface shape at the position of the enlarged recess to detect an impression of said contact probe.

35. The data processing method according to claim 34, further comprising:
a surface averaging step for averaging the surface shape which is scanned from said contact pad as three-dimensional data;
wherein said part extracting step differentiates the averaged surface shape to extract a multiplicity of flat parts.

36. A data processing method for use with a data processing apparatus associated with a probe testing apparatus for determining whether a contact probe is acceptable or defective when said contact probe is in pressure contact with a contact pad on an integrated circuit, said method comprising the steps of:
applying a surface shape of at least one of said contact pad and said contact probe detected as three-dimensional data;

analyzing the surface shape through imaging; and determining front the result of the analysis whether said contact probe is acceptable or defective;

the method further comprising:

a cross-section detecting step for detecting a cross-sectional area of said contact probe at a predetermined position thereof from the end shape imaged from said contact probe as three-dimensional data; and a probe determining step for determining whether said contact probe is acceptable or defective depending on whether or not the detected cross-sectional area falls within a predetermined tolerance range.

37. The data processing method according to claim 36 further comprising:

a peak detecting step for detecting a peak of said contact probe in the axial direction from the end shape imaged from said contact probe as three-dimensional data;

wherein said cross-section detecting step detects a cross-sectional area of said contact probe at a position retraced by a predetermined distance in the axial direction from the detected peak.

38. A data processing method for use with a data processing apparatus associated with a probe testing apparatus for determining whether a contact probe is acceptable or defective when said contact probe is in pressure contact with a contact pad on an integrated circuit, said method comprising the steps of:

applying a surface shape of at least one of said contact pad and said contact probe detected as three-dimensional data;

analyzing the surface shape through imaging; and determining from the result of the analysis whether said contact probe is acceptable or defective;

the method further comprising:

a flat part detecting step for detecting a flat part perpendicular to the axial direction from the end shape imaged from said contact probe as three-dimensional data;

a curvature detecting step for sequentially detecting curvatures along a contour of the detected flat part;

a fragment detecting step for detecting a fragmentary length of the contour over which the detected curvature falls within a predetermined abnormal range; and a probe determining step for determining whether said contact probe is acceptable or defective depending on whether or not the ratio of a total of the detected fragmentary lengths to the overall length of the contour falls within a predetermined tolerance range.

39. The data processing method according to claim 38, further comprising:

a curvature averaging step for individually averaging a multiplicity of the detected curvatures;

wherein said fragment detecting step for detects fragmentary length of the contour over which the averaged curvature falls within a predetermined abnormal range.

40. A data processing method for use with a data processing apparatus associated with a probe testing apparatus for determining whether a contact probe is acceptable or defective when said contact probe is in pressure contact with a contact pad on an integrated circuit, said method comprising the steps of:

applying a surface shape of at least one of said contact pad and said contact probe detected as three-dimensional data;

analyzing the surface shape through imaging; and determining from the result of the analysis whether said contact probe is acceptable or defective;

the method further comprising:

a flat part detecting step for detecting a flat part perpendicular to the axial direction from the end shape imaged from said contact probe as three-dimensional data;

an area detecting step for detecting the area of the detected flat part;

a diameter detecting step for detecting a maximum diameter of the detected flat part;

an area calculating step for calculating the area of the flat part from the detected diameter; and a probe determining step for determining whether said contact probe is acceptable or defective depending on whether or not the ratio of the detected area to the calculated area falls within a predetermined tolerance range.

41. An information storage medium having a computer program stored thereon for a data processing apparatus associated with a probe testing apparatus for determining whether a contact probe is acceptable or defective when said contact probe is in pressure contact with a contact pad on an integrated circuit, said computer program causing said data processing apparatus to execute the processing of:

applying a surface shape of at least one of said contact pad and said contact probe detected as three-dimensional data;

analyzing the surface shape through imaging; and determining from the result of the analysis whether said contact probe is acceptable or defective;

wherein said computer program further causes said data processing apparatus to execute:

part extraction processing for differentiating the read surface shape to extract a multiplicity of flat parts;

reference generation processing for complementing the multiplicity of extracted flat parts to generate a reference shape;

recess detection processing for subtracting said generated reference shape from the read surface shape to detect a plurality of recesses having a predetermined depth or more;

recess selection processing for selecting one from the plurality of detected recesses corresponding to reference information;

impression detection processing for subtracting said reference shape from the read surface shape at the position of the selected recess to detect an impression of said contact probe;

shape detection processing for detecting at least one of a depth, a position and a shape of the detected impression; and probe determination processing for determining from at least one of the detected depth, position and shape of the impression whether said contact probe is acceptable or defective.

42. The information storage medium according to claim 41, wherein said computer program further causes said data processing apparatus to execute;

recess enlargement processing for enlarging the selected recess outward by predetermined dimensions;

wherein said impression detecting processing subtracts said reference shape from the read surface shape at the position of the enlarged recess to detect an impression of said contact probe.

43. The information storage medium according to claim 42, wherein said computer program further causes said data processing apparatus to execute:

surface averaging processing for averaging the surface shape which is scanned from said contact pad as three-dimensional data;

wherein said part extraction processing differentiates the averaged surface shape to extract a multiplicity of flat parts.

44. An information storage medium having a computer program stored thereon for a data processing apparatus associated with a probe testing apparatus for determining whether a contact probe is acceptable or defective when said contact probe is in pressure contact with a contact pad on an integrated circuit, said computer program causing said data processing apparatus to execute the processing of:

applying a surface shape of at least one of said contact pad and said contact probe detected as three-dimensional data;

analyzing the surface shape through imaging; and determining from the result of the analysis whether said contact probe is acceptable or defective;

wherein said computer program further causes said data processing apparatus to execute:

cross-section detection processing for detecting a cross-sectional area of said contact probe at a predetermined position thereof from the end shape imaged from said contact probe as three-dimensional data; and probe determination processing for determining whether said contact probe is acceptable or defective depending on whether or not the detected cross-sectional area falls within a predetermined tolerance range.

45. The information storage medium according to claim 44, wherein said computer program further causes said data processing apparatus to execute:

peak detection processing for detecting a peak of said contact probe in the axial direction from the end shape imaged from said contact probe as three-dimensional data;

wherein said part cross-section detection processing detects a cross-sectional area of said contact probe at a position retraced by a predetermined distance in the axial direction from the detected peak.

46. An information storage medium having a computer program stored thereon for a data processing apparatus associated with a probe testing apparatus for determining whether a contact probe is acceptable or defective when said contact probe is in pressure contact with a contact pad on an integrated circuit, said computer program causing said data processing apparatus to execute the processing of:

applying a surface shape of at least one of said contact pad and said contact probe detected as three-dimensional data;

analyzing the surface shape through imaging; and determining from the result of the analysis whether said contact probe is acceptable or defective;

wherein said computer program further causes said data processing apparatus to execute:

flat part detection processing for detecting a flat part perpendicular to the axial direction from the end shape imaged from said contact probe as three-dimensional data;

curvature detection processing for sequentially detecting curvatures along a contour of the detected flat part;

fragment detection processing for detecting a fragmentary length of the contour over which the detected curvature falls within a predetermined abnormal range; and probe determination processing for determining whether said contact probe is acceptable or defective depending on whether or not the ratio of a total of the detected fragmentary lengths to the overall length of the contour falls within a predetermined tolerance range.

47. The information storage medium according to claim 46, wherein said computer program further causes said data processing apparatus to execute:

curvature averaging processing for individually averaging a multiplicity of the detected curvatures;

wherein said fragment detection processing detects a fragmentary length of the contour over which the averaged curvature falls within a predetermined abnormal range.

48. An information storage medium having a computer program stored thereon for a data processing apparatus associated with a probe testing apparatus for determining whether a contact probe is acceptable or defective when said contact probe is in pressure contact with a contact pad on an integrated circuit, said computer program causing said data processing apparatus to execute the processing of:

applying a surface shape of at least one of said contact pad and said contact probe detected as three-dimensional data;

applying the surface shape through imaging; and determining from the result of the analysis whether said contact probe is acceptable or defective;

wherein said computer program further causes said data processing apparatus to execute:

flat part detection processing for detecting a flat part perpendicular to the axial direction from the end shape imaged from said contact probe as three-dimensional data;

area detection processing for detecting the area of the detected flat part;

diameter detection processing for detecting a maximum diameter of the detected flat part;

area calculation processing for calculating the area of the flat part from the detected diameter; and probe determination processing for determining whether said contact probe is acceptable or defective depending on whether or not the ratio of the detected area to the calculated area falls within a predetermined tolerance range.

* * * * *